(12) United States Patent
Guzman et al.

(10) Patent No.: US 9,278,484 B2
(45) Date of Patent: Mar. 8, 2016

(54) METHOD AND APPARATUS FOR PRODUCING CONTOURED COMPOSITE STRUCTURES AND STRUCTURES PRODUCED THEREBY

(75) Inventors: Juan Carlos Guzman, Seattle, WA (US); Douglas Alan McCarville, Orting, WA (US); Joseph L. Sweetin, Edmonds, WA (US); Ross Messinger, Tustin, CA (US)

(73) Assignee: THE BOEING COMPANY, Chicago, IL (US)

( * ) Notice: Subject to any disclaimer, the term of this patent is extended or adjusted under 35 U.S.C. 154(b) by 169 days.

(21) Appl. No.: 13/013,097

(22) Filed: Jan. 25, 2011

(65) Prior Publication Data

US 2012/0076973 A1 Mar. 29, 2012

Related U.S. Application Data

(63) Continuation-in-part of application No. 12/104,529, filed on Apr. 17, 2008, now Pat. No. 9,090,028, and a continuation-in-part of application No. 12/396,418, filed on Mar. 2, 2009, now Pat. No. 8,932,423.

(51) Int. Cl.
*B29C 70/40* (2006.01)
*B29C 70/20* (2006.01)
(Continued)

(52) U.S. Cl.
CPC .............. *B29C 70/207* (2013.01); *B29C 70/30* (2013.01); *B29C 70/44* (2013.01); *B29L 2031/003* (2013.01); *B29L 2031/3082* (2013.01);
(Continued)

(58) Field of Classification Search
CPC .... B29C 70/04; B29C 70/502; B29C 70/521; B29C 70/10; B29C 70/12; B29C 70/44; B29C 70/207; B29C 70/30; B29C 70/38; B32B 38/185; B29L 2031/003; B29L 2031/3082
USPC ......... 156/212, 166, 180, 210, 264, 256, 269, 156/270
See application file for complete search history.

(56) References Cited

U.S. PATENT DOCUMENTS 3,042,562 A 7/1962 Peterson
3,259,021 A 7/1966 Appleton et al.
(Continued)

FOREIGN PATENT DOCUMENTS

DE 3223231 A1 1/1983
DE 3249987 C2 8/1995
(Continued)

OTHER PUBLICATIONS

Amendment Pursuant to Request for Continued Examination, dated Aug. 9, 2012, regarding U.S. Appl. No. 12/776,781, 6 pages.
(Continued)

*Primary Examiner* — Christopher Schatz
(74) *Attorney, Agent, or Firm* — Yee & Associates, P.C.

(57) ABSTRACT

A contoured composite structure includes an axis of curvature and at least one curved leg. The structure is fabricated by laying up a flat stack of prepreg fiber plies each having non-zero degree fiber orientations relative to an axis of curvature, and laying up at least one prepreg fiber ply on the stack having a zero degree fiber orientation. Laying up the zero degree ply includes placing prepreg tows in segments arranged end-to-end on at least a portion of the stack. The stack is formed into a web and a curved leg.

17 Claims, 23 Drawing Sheets

(51) Int. Cl.
*B29C 70/30* (2006.01)
*B29C 70/44* (2006.01)
B32B 37/10 (2006.01)
B29L 31/00 (2006.01)
B29L 31/30 (2006.01)

(52) U.S. Cl.
CPC ............... *B32B37/10* (2013.01); *Y10T 156/10* (2015.01); *Y10T 156/1052* (2015.01); *Y10T 156/14* (2015.01); *Y10T 428/24124* (2015.01); *Y10T 428/24132* (2015.01); *Y10T 428/24628* (2015.01)

(56) References Cited

U.S. PATENT DOCUMENTS

| | | | |
|---|---|---|---|
| 3,556,922 | A | 1/1971 | Green et al. |
| 3,775,219 | A | 11/1973 | Karlson et al. |
| 4,133,711 | A | 1/1979 | August et al. |
| 4,208,238 | A | 6/1980 | August et al. |
| 4,249,704 | A | 2/1981 | Sakaue et al. |
| 4,305,903 | A | 12/1981 | Krause |
| 4,475,976 | A | 10/1984 | Mittelstadt et al. |
| 4,541,886 | A | 9/1985 | Marlow et al. |
| 4,576,849 | A | 3/1986 | Gardiner |
| 4,588,466 | A | 5/1986 | Eaton |
| 4,591,402 | A | 5/1986 | Evans et al. |
| 4,696,707 | A | 9/1987 | Lewis et al. |
| 4,707,214 | A | 11/1987 | Nithart et al. |
| 4,720,255 | A | 1/1988 | Mittelstadt |
| 4,726,924 | A | 2/1988 | Mittelstadt |
| 4,750,965 | A | 6/1988 | Pippel et al. |
| 4,847,063 | A | 7/1989 | Smith |
| 4,867,834 | A | 9/1989 | Alenskis et al. |
| 4,955,803 | A | 9/1990 | Miller et al. |
| 5,038,291 | A | 8/1991 | Wang et al. |
| 5,242,523 | A | 9/1993 | Willden et al. |
| 5,292,475 | A | 3/1994 | Mead et al. |
| 5,358,583 | A | 10/1994 | Hatchadoorian et al. |
| 5,431,749 | A | 7/1995 | Messner |
| 5,431,984 | A | 7/1995 | Keck et al. |
| 5,492,979 | A | 2/1996 | Pater |
| 5,538,589 | A | 7/1996 | Jensen et al. |
| 5,648,109 | A | 7/1997 | Gutowski et al. |
| 6,096,164 | A | 8/2000 | Benson et al. |
| 6,355,133 | B1 | 3/2002 | Williams |
| 6,451,152 | B1 | 9/2002 | Holmes et al. |
| 6,454,893 | B1 * | 9/2002 | McKague, Jr. ............... 156/166 |
| 6,547,910 | B1 | 4/2003 | Benzing et al. |
| 6,595,467 | B2 | 7/2003 | Schmidt |
| 6,613,258 | B1 | 9/2003 | Maison et al. |
| 6,648,273 | B2 | 11/2003 | Anast |
| 6,723,271 | B2 | 4/2004 | Hemphill et al. |
| 7,008,580 | B2 | 3/2006 | Eberth et al. |
| 7,056,402 | B2 | 6/2006 | Koerwien et al. |
| 7,115,180 | B2 | 10/2006 | Bruyere |
| 7,134,629 | B2 | 11/2006 | Johnson et al. |
| 7,137,182 | B2 | 11/2006 | Nelson |
| 7,138,167 | B2 | 11/2006 | Sakonjo et al. |
| 7,175,795 | B2 | 2/2007 | Eberth et al. |
| 7,469,735 | B2 | 12/2008 | Brown et al. |
| 7,513,769 | B2 | 4/2009 | Benson et al. |
| 7,527,222 | B2 | 5/2009 | Biornstad et al. |
| 7,544,261 | B1 | 6/2009 | Vines et al. |
| 7,670,525 | B2 | 3/2010 | Weidmann et al. |
| 7,790,082 | B2 | 9/2010 | Buge et al. |
| 7,842,145 | B2 | 11/2010 | Hogg |
| 7,943,076 | B1 | 5/2011 | Hawkins et al. |
| 2002/0149134 | A1 | 10/2002 | Hemphill et al. |
| 2003/0168775 | A1 | 9/2003 | Eberth et al. |
| 2003/0173019 | A1 | 9/2003 | Eberth et al. |
| 2003/0222371 | A1 | 12/2003 | Edelmann et al. |
| 2004/0074587 | A1 | 4/2004 | Koerwien et al. |
| 2004/0134593 | A1 | 7/2004 | Ishibashi et al. |
| 2005/0042410 | A1 | 2/2005 | Sakonjo et al. |
| 2005/0056362 | A1 | 3/2005 | Benson et al. |
| 2005/0067731 | A1 | 3/2005 | Bruyere |
| 2005/0263645 | A1 | 12/2005 | Johnson et al. |
| 2006/0073309 | A1 | 4/2006 | Hogg |
| 2006/0216480 | A1 | 9/2006 | Weidmann et al. |
| 2006/0216490 | A1 | 9/2006 | Ishii et al. |
| 2006/0249868 | A1 | 11/2006 | Brown et al. |
| 2007/0029038 | A1 | 2/2007 | Brown et al. |
| 2007/0138695 | A1 | 6/2007 | Krogager et al. |
| 2007/0161483 | A1 | 7/2007 | Raf |
| 2007/0175575 | A1 | 8/2007 | Rubin et al. |
| 2008/0230652 | A1 | 9/2008 | Biornstad et al. |
| 2009/0139644 | A1 | 6/2009 | Nogueroles Vines et al. |
| 2009/0261199 | A1 | 10/2009 | McCarville et al. |
| 2009/0263618 | A1 | 10/2009 | McCarville et al. |
| 2010/0136293 | A1 | 6/2010 | Kubryk et al. |
| 2011/0097554 | A1 | 4/2011 | Kehrl et al. |

FOREIGN PATENT DOCUMENTS

| | | |
|---|---|---|
| EP | 0496695 A2 | 7/1992 |
| EP | 1666353 A1 | 6/2006 |
| EP | 1800840 A1 | 6/2007 |
| EP | 1804146 A1 | 7/2007 |
| EP | 1995040 A1 | 11/2008 |
| EP | 1995046 A2 | 11/2008 |
| EP | 2233625 A1 | 9/2010 |
| FR | 2515106 A1 | 4/1983 |
| FR | 2635484 A1 | 2/1990 |
| GB | 763972 A | 12/1956 |
| GB | 2467417 A | 8/2010 |
| JP | 2003317547 A | 11/2003 |
| JP | 2004276393 A | 10/2004 |
| JP | 2009166279 A | 7/2009 |
| JP | 2010150685 A | 7/2010 |
| WO | 9922932 A1 | 5/1999 |
| WO | 03099545 A1 | 12/2003 |
| WO | 2005011961 A1 | 2/2005 |
| WO | WO2006070015 A1 | 7/2006 |
| WO | 2006119002 A2 | 11/2006 |
| WO | WO2006136560 A1 | 12/2006 |
| WO | 2007018935 A1 | 2/2007 |
| WO | WO2007074179 A1 | 7/2007 |
| WO | 2009129007 A2 | 10/2009 |
| WO | PCTUS2009/037073 | 10/2009 |
| WO | 2010101741 A2 | 9/2010 |

OTHER PUBLICATIONS

USPTO Notice of Allowance, dated Aug. 17, 2012, regarding U.S. Appl. No. 12/776,781, 10 pages.
Office Action, dated Jan. 11, 2013, regarding U.S. Appl. No. 11/119,756, 38 pages.
Kehrl et al., "Curved Composite Frames and Method of Making the Same," U.S. Appl. No. 13/684,988 and Preliminary Amendment, filing date Nov. 26, 2012, 71 pages.
European Patent Office Communication, dated Oct. 14, 2009, regarding Application No. EP06769909.0, 3 pages.
Dickson et al., "Design and Analysis of a Stiffened Composite Fuselage Panel," NASA Contractor Report 159302, Aug. 1980, 52 pages.
"Fabrics and Preforms," In: ASM Handbook vol. 21: Composites, Miracle et al. (Eds.), ASM International, Materials Park, OH, pp. 64-65, Dec. 2001.
International Search Report dated Oct. 31, 2006, regarding Application No. PCT/US2006/027067 (WO2007018935), 2 pages.
International Search Report dated Feb. 15, 2007, regarding Application No. PCT/US2006/016191 (WO2006119002), 5 pages.
International Search Report dated May 10, 2010, regarding Application No. GB1000777.1 (GB2467417), 6 pages.
International Search Report dated Nov. 5, 2010, regarding Application No. PCT/US2010/025110 (WO2010101741), 2 pages.
Shirinzadeh et al., "Trajectory generation for open-contoured structures in robotic fibre placement," Robotics and Computer-Integrated Manufacturing, vol. 23, issue 4, pp. 380-394, Mar. 2007.
USPTO Office Action, dated Dec. 23, 2008, regarding U.S. Appl. No. 11/119,756, 13 pages.

(56) References Cited

OTHER PUBLICATIONS

USPTO Final Office Action, dated Jun. 18, 2009, regarding U.S. Appl. No. 11/119,756, 13 pages.
USPTO Office Action, dated Sep. 28, 2010, regarding U.S. Appl. No. 11/119,756, 18 pages.
USPTO Final Office Action, dated Feb. 14, 2011, regarding U.S. Appl. No. 11/119,756, 14 pages.
USPTO Office Action, dated Sep. 19, 2011, regarding U.S. Appl. No. 11/119,756, 14 pages.
USPTO Final Office Action, dated Feb. 29, 2012, regarding U.S. Appl. No. 11/119,756, 17 pages.
USPTO Office Action, dated Mar. 5, 2008, regarding U.S. Appl. No. 11/195,786, 15 pages.
USPTO Notice of Allowance, dated Aug. 25, 2008, regarding U.S. Appl. No. 11/195,786, 7 pages.
USPTO Office Action, dated Feb. 9, 2011, regarding U.S. Appl. No. 12/104,529, 17 pages.
Response to Office Action, dated May 4, 2011, regarding U.S. Appl. No. 12/104,529, 28 pages.
Revised Response to Office Action, dated Aug. 11, 2011, regarding U.S. Appl. No. 12/104,529, 30 pages.
USPTO Final Office Action, dated Oct. 28, 2011, regarding U.S. Appl. No. 12/104,529, 12 pages.
Response to Final Office Action, dated Jan. 30, 2012, regarding U.S. Appl. No. 12/104,529, 12 pages.
USPTO Office Action, dated Nov. 8, 2010, regarding U.S. Appl. No. 12/363,746, 17 pages.
USPTO Notice of Allowance, dated Mar. 29, 2011, regarding U.S. Appl. No. 12/363,746, 8 pages.
USPTO Office Action, dated Jul. 19, 2011, regarding U.S. Appl. No. 12/396,418, 11 pages.
Response to Office Action, dated Oct. 18, 2011, regarding U.S. Appl. No. 12/396,418, 25 pages.
USPTO Final Office Action, dated Dec. 30, 2011, regarding U.S. Appl. No. 12/396,418, 9 pages.
USPTO Office Action, dated Oct. 18, 2011, regarding U.S. Appl. No. 12/776,781, 15 pages.
Response to Office Action, dated Feb. 21, 2012, regarding U.S. Appl. No. 12/776,781, 31 pages.
Response to Final Office Action, dated Mar. 30, 2012, regarding U.S. Appl. No. 12/396,418, 16 pages.
USPTO final office action dated May 16, 2012 regarding U.S. Appl. No. 12/776,781, 26 pages.
International Search Report, dated Apr. 16, 2012, regarding Application No. PCT/US2011/066763, 13 pages.
Notice of Allowance, dated Aug. 16, 2013, regarding U.S. Appl. No. 11/119,756, 16 pages.
Klenner, "Evaluation and Selection Algorithms of Cost-Optimised Prepreg Application Methods in the Context of Manufacturing Highly Stressed Aircraft Components of Fibre-Reinforced Plastic," Doctoral Dissertation, Technische Universität Carolo-Wilhelmina zu Braunschweig (DE), Apr. 5, 1988, pp. 9, 18-25, 55-56, 64-68, & 154-156.
Office Action, dated Jun. 3, 2013, regarding U.S. Appl. No. 13/684,988, 25 pages.
International Preliminary Report on Patentability, dated Jul. 30, 2013, regarding Application No. PCT/US2011/066763, 6 pages.
Office Action, dated Dec. 27, 2013, regarding U.S. Appl. No. 12/104,529, 52 pages.
Final Office Action dated Dec. 6, 2013, regarding U.S. Appl. No. 13/684,988, 14 pages.
Notice of Allowance, dated Sep. 5, 2014, regarding U.S. Appl. No. 12/396,418, 16 pages.
Final Office Action, dated Aug. 14, 2014, regarding U.S. Appl. No. 12/104,529, 17 pages.
Office Action, dated Feb. 25, 2014, regarding U.S. Appl. No. 12/396,418, 45 pages.
Office Action, dated Nov. 25, 2014, regarding U.S. Appl. No. 12/104,529, 7 pages.
Final Office Action, dated Feb. 5, 2015, regarding U.S. Appl. No. 12/104,529, 17 pages.
Office Action dated Dec. 4, 2014, regarding U.S. Appl. No. 13/684,988, 18 pages.
Chinese Patent Office Action and English Translation, dated Dec. 29, 2014, regarding Application No. 201180065977.6, 17 pages.
Japanese Patent Office Action and English Translation, dated Apr. 7, 2015, regarding Application No. 2011-505058, 5 pages.
Notice of Allowance, dated Mar. 20, 2015, regarding U.S. Appl. No. 12/104,529, 11 pages.
Notice of Allowance dated Apr. 1, 2015, regarding U.S. Appl. No. 13/684,988, 14 pages.
Notice of Reasons for Rejection and English Translation, issued Aug. 18, 2015, regarding Japanese Patent Application No. 2013-550477, 5 pages.
Office Action, dated Sep. 24, 2015 regarding U.S. Appl. No. 14/082,839, 43 pages.

* cited by examiner

METHOD AND APPARATUS FOR PRODUCING CONTOURED COMPOSITE STRUCTURES AND STRUCTURES PRODUCED THEREBY

CROSS REFERENCE TO RELATED APPLICATIONS

This application is a continuation-in-part of U.S. patent application Ser. Nos. 12/104,529 filed Apr. 17, 2008 now U.S. Pat. No. 9,090,028 and 12/396,418 filed Mar. 2, 2009, now U.S. Pat. No. 8,932,423, the entire disclosures of which are incorporated by reference herein.

TECHNICAL FIELD

This disclosure generally relates to techniques for fabricating composite parts, and deals more particularly with a method for producing highly contoured non-Cartesian coordinate composite structures using unidirectional pre-impregnated composite tape and automated tape placement equipment.

BACKGROUND

Highly contoured, multi-leg composite structures may be used in a variety of applications, such as in aerospace vehicles. Aerospace vehicle frames, spars, ribs, stringers and similar structures may have multiple legs which are contoured along the length of the structure. One known technique for fabricating such structures involves hot drape forming a flat composite charge over multiple contoured tools in order to form one or more curved legs in the structure. A charge typically comprises multiple plies of unidirectional prepreg fiber laid up according to a predetermined ply schedule. Difficulty may be encountered however, when attempting to hot drape form flat charges that contain zero degree plies, i.e. plies having a fiber orientation that is aligned substantially parallel with the axis of curvature of the structure. This difficulty stems from the fact that where zero degree fibers are used that are substantially inextensible, such as carbon fibers, the fibers may not undergo a change in geometry, i.e. bunching, stretching or spreading during the forming process. Consequently, zero degree fibers may not be moved from one plane to a different plane that possesses a substantially different arc length. If the leg is too convex, the fibers may wrinkle, whereas if the leg is too concave, the fibers may lock in place and resist out-of-plane forming pressures.

To overcome the above-mentioned problem, zero degree plies are hand-placed on the charge after the non-zero plies have been formed into curved legs. The need to place the zero degree plies on a leg after it has been drape formed must be repeated each time a zero degree ply is required by the layup schedule. These multiple operations increase costs, complicate tooling, may add to floor space requirements and may adversely affect manufacturing flow times.

Another disadvantage of known techniques for forming highly contoured composite structures having multiple legs relates to the need for forming each of the legs in a separate forming operation using different sets of tools. Forming the legs of the structure using different sets of tools also may contribute to higher costs and longer production flow times.

Accordingly, there is a need for a method and apparatus for producing contoured composite structures having one or more legs that reduce the number of operations required to form the legs, while avoiding bunching or wrinkling of the zero degree plies during forming. There is also a need for apparatus for forming such structures that allows forming two curved legs on the structure using a single tool in a single forming operation.

SUMMARY

A method and apparatus are provided for fabricating highly contoured composite structures having one or more curved legs, using unidirectional composite materials such as prepreg fiber tape. Constant width tape segments are placed and aligned to maintain a polar fiber orientation during the fabrication of highly curved, multi-leg composite structures, such as frames, spars, ribs and stringers, to name only a few. The disclosed method may eliminate the need for separately placing zero degree plies on legs after they have been drape formed. Flat composite charges containing zero degree plies may be hot drape formed under tension over one or more contoured tool surfaces of a single tool to form curved legs without substantial wrinkling or other fiber distortion. The disclosed apparatus comprises a tool that may be used to drape form two curved legs of the structure in a single forming operation.

According to one disclosed embodiment, a method is provided of fabricating a contoured composite structure having an axis of curvature and at least one curved leg. The method comprises laying up a flat stack of prepreg fiber plies and forming a curved leg in the stack. The prepreg fiber plies each include unidirectional fiber tows, and the stack is laid up by aligning the tows relative to the axis of curvature of the structure and segmenting at least certain of the tows over a portion the stack. Forming the curved leg in the stack is performed by forming the portion of the stack having the tow segments over a curved tool.

According to another embodiment, a method is provided of fabricating a contoured composite structure having an axis of curvature and at least one curved leg. The method comprises laying up a flat stack of prepreg fiber plies each having non-zero degree fiber orientations relative to an axis of curvature, and laying up a prepreg fiber ply on the stack having a zero degree fiber orientation. Laying up the zero degree ply includes placing prepreg tows in segments arranged end-to-end on at least a portion of the stack. The method further includes forming the stack including the zero degree ply into a web and a curved leg.

According to a further embodiment, apparatus is provided for fabricating a contoured composite structure having curved legs. The apparatus comprises a mandrel adapted to having flat composite charge placed thereon and having first and second curved mandrel surfaces against which the charge may be formed respectively into first and second curved legs. The apparatus further includes a tool for forming the flat charge against the first curved mandrel surface. The apparatus also includes a flexible vacuum bag adapted to cover the mandrel and the tool for forming the charge against the second curved mandrel surface. The mandrel may include a third surface against which the charge may be held by the tool while the charge is being formed against the first and second mandrel surfaces.

According to another embodiment, a method is provided of fabricating a contoured composite structure. The method comprises placing a flat composite charge on the mandrel, and using the mandrel to form the charge into a pair of curved legs connected by a curved web. The method further comprises stabilizing the charge in preparation for forming by holding the charge between a tool and a surface on the mandrel.

According to another embodiment, apparatus is provided for fabricating a composite structure having curved legs. The apparatus comprises first and second matched tool halves relatively shiftable from an open position to a closed, forming position. The first and second tool halves respectively include first and second mandrels over which portions of a flat composite charge may be respectively formed into first and second curved legs. The first and second mandrels respectively include opposing surfaces between which a portion of the charge may be held during forming of the legs.

According to another embodiment, a method is provided of fabricating a composite structure comprising holding a flat composite charge between first and second mandrels. The method further comprises using a first vacuum bag to form a first portion of the charge against the first mandrel, and using a second vacuum bag to form a second portion of the charge against the second mandrel.

Other features, benefits and advantages of the disclosed embodiments will become apparent from the following description of embodiments, when viewed in accordance with the attached drawings and appended claims

BRIEF DESCRIPTION OF THE ILLUSTRATIONS

DETAILED DESCRIPTION

Figure 1:
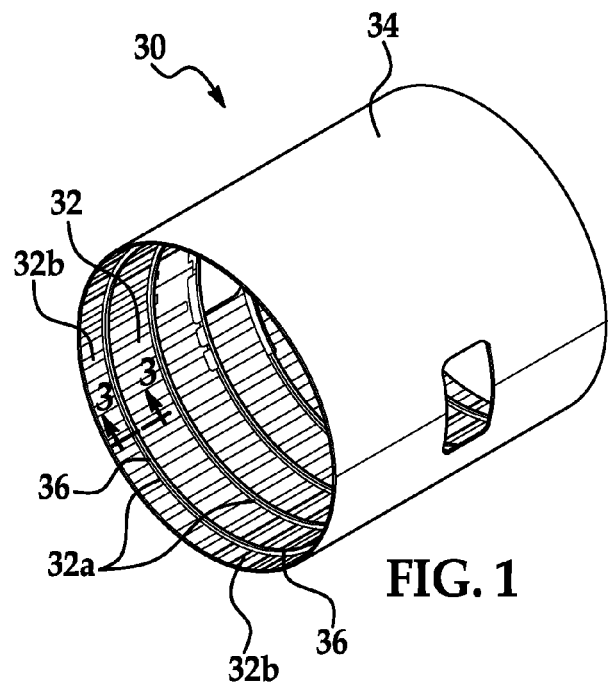
FIG. 1 is a perspective illustration of a barrel section of an aircraft fuselage.
Figure 2:
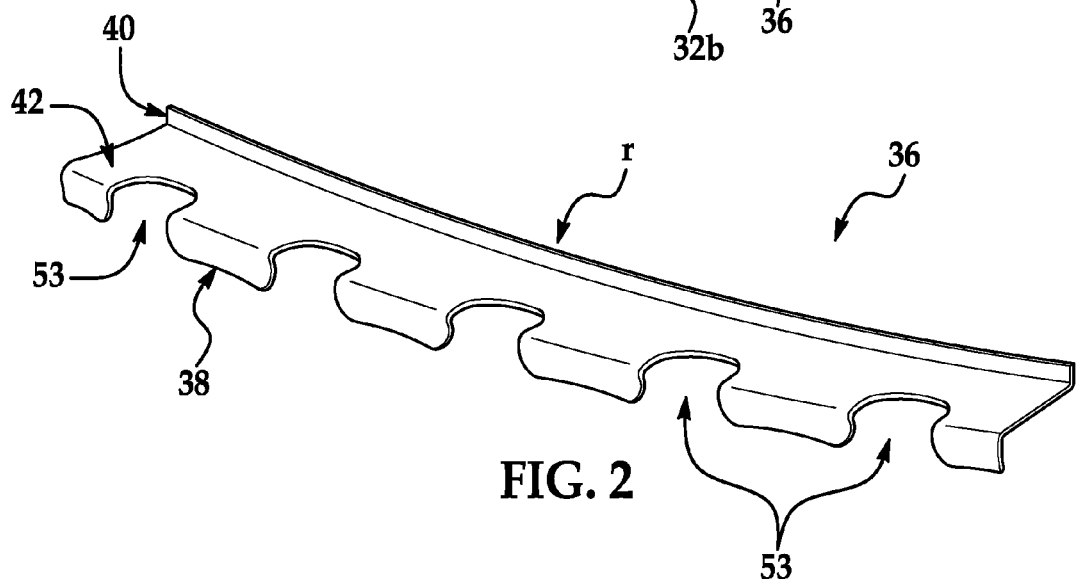
FIG. 2 is a perspective illustration of a highly contoured composite frame section used in the fuselage shown in FIG. 1.
Figure 3:
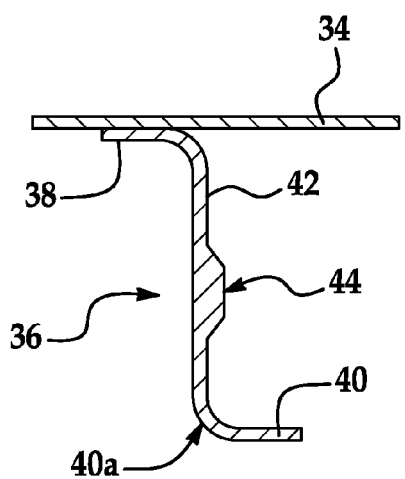
FIG. 3 is a sectional illustration taken along the line 3-3 in FIG. 1.

Referring first to FIGS. 1-3, a barrel shaped fuselage section 30 comprises an outer skin 34 formed over and fastened to a frame structure 32. The frame structure comprises a plurality of longitudinally spaced, barrel frames 32a and longitudinally extending stringers 32b which pass through the barrel frames 32a. Each of the barrel frames 32a may comprise curved or contoured composite members which may be in the form of the form of multiple curved frame sections 36 that are spliced together using any suitable means, such as without limitation, splice plates (not shown) and fasteners (not shown). In some applications however, curved half frame and full frame sections (not shown) may be possible. It should be noted here that the curved frame sections 36 are merely illustrative of a wide range of curved or contoured composite members that may be fabricated by the disclose method and apparatus.

Figure 4:
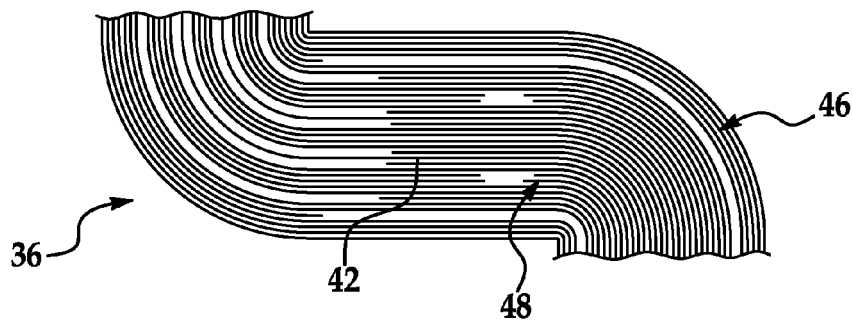
FIG. 4 is a sectional illustration showing a ply buildup for the frame section shown in FIG. 2.

As best seen in FIG. 3, each of the frame sections 36, sometimes also referred to hereinafter as a curved or contoured composite member, may have a generally Z-shaped cross section and may include a curved outer chord 38 connected to a curved inner chord 40 by a curved web 42. The outer and inner chords 38, 40, when viewed in cross section (FIG. 3), effectively form "legs" that extend traverse to the web 42. Thus, as used herein, the terms "leg" and "legs" refer to one or more structural features such as, without limitation, caps or flanges that extend traverse to other features of a contoured structure such as, without limitation, a web. In the illustrated embodiment, the web 42 may include an optional reinforcing pad 44. The outer chord 38 forms a shear tie to which the skin 34 may be coupled and/or fastened. The outer chord 38 as well as one edge of the web 42 may include a plurality of spaced apart, mousehole-shaped cutouts 53 through which the stringers 32b extend. As will be discussed below, the frame section 36 is formed from laminated plies of a fiber reinforced synthetic resin, such as carbon fiber epoxy. As shown in FIG. 4, the frame section 36 may include a ply buildup comprising full plies 46 and partial plies 48 which are arranged and oriented to provide maximum structural performance while facilitating the use of a later discussed fabrication method that is both efficient and repeatable.

Figure 5:
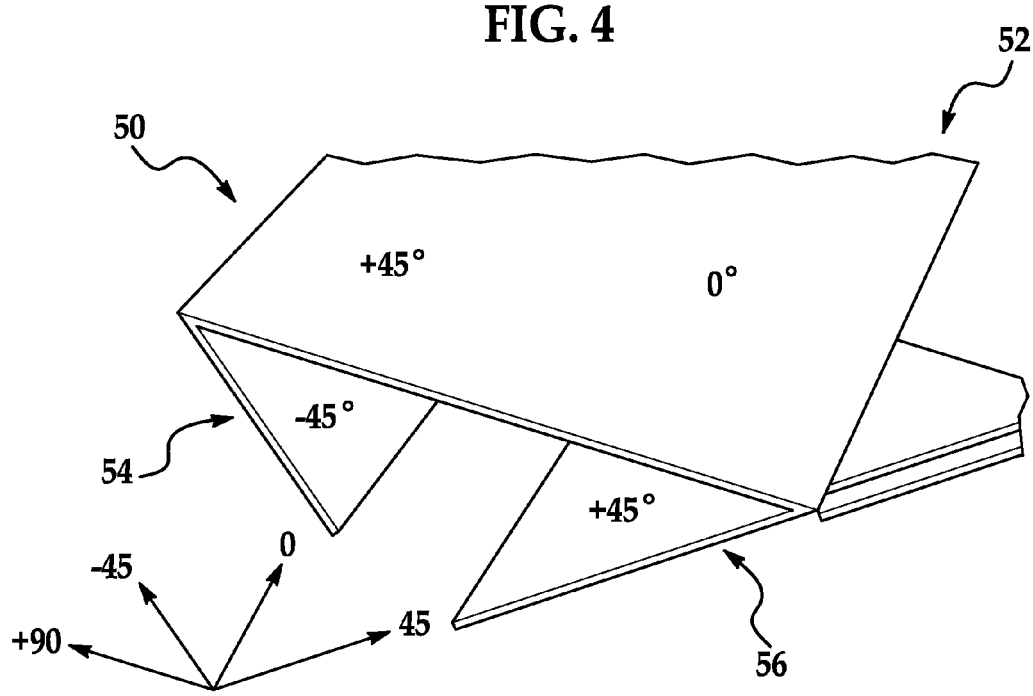
FIG. 5 is a perspective illustration of a flat ply stack used in the fabrication of the frame section shown in FIG. 2.
Figure 6:
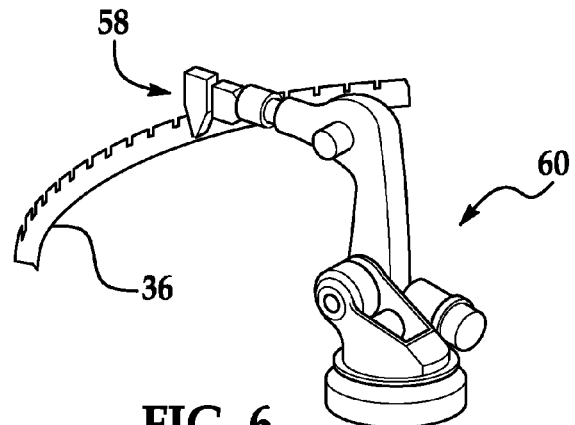
FIG. 6 is a perspective illustration of an AFP robotic machine used to place the stack of plies.
Figure 7:
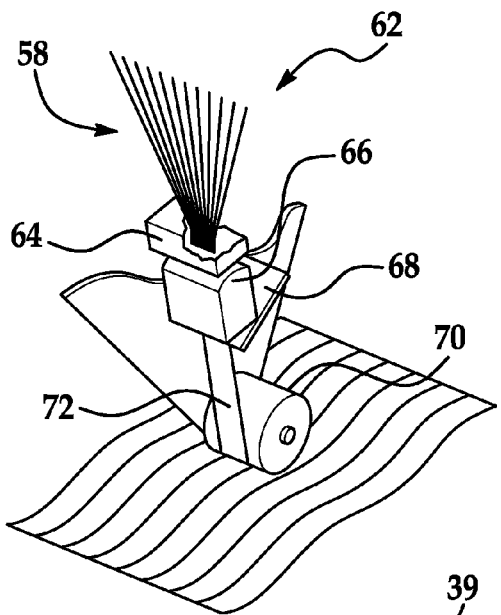
FIG. 7 is a perspective illustration of an AFP machine used as an end defector on the robot shown in FIG. 6.

Referring now to FIGS. 5-7, an AFP machine 58 may be used as an end effecter on a robot 60 to laydown fiber tows or strips of fiber pre-preg tape to form a flat ply stack 50, sometimes also referred to herein as a flat charge 50. The AFP machine 58 may include combs 64 that receive incoming pre-preg tows 62 that pass through a ribonizer 66 before being severed by a tow cutter 68. The cut tows 72 pass beneath a compliant roller 70 that applies and compacts the tows 62 on a substrate (not shown) or an underlying ply layer (not shown). As best seen in FIG. 5, the AFP machine 58 may be used to laydown fiber tows 62 or tapes in which the fibers are oriented at preselected angles in a Cartesian coordinate system 47. In the illustrated example, the ply stack 50 includes fiber tows oriented at 0 degrees, fiber tows 56 oriented at +45 degrees and fiber tows 54 oriented at −45 degrees. Not shown, but embedded in the ply stack 50 are fiber tows oriented at 90 degrees.

Figure 8:
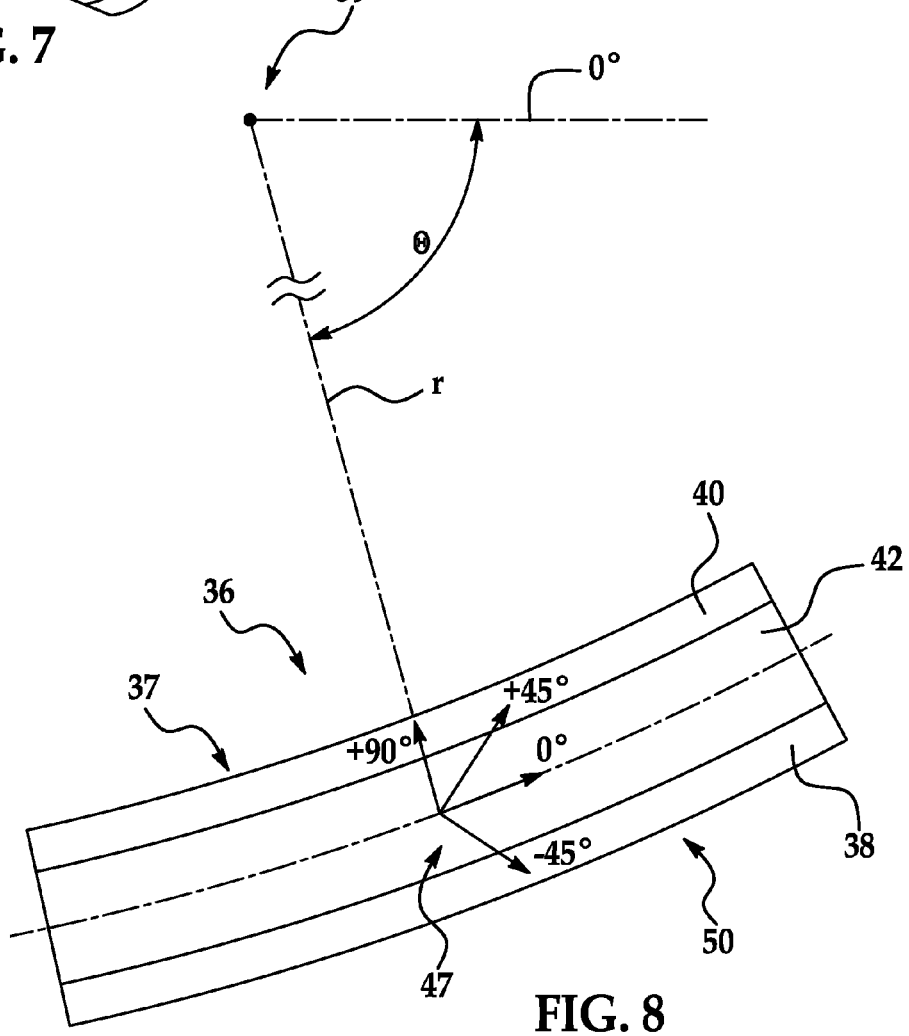
FIG. 8 is a diagrammatic illustration showing the polar and Cartesian coordinate systems used to define ply orientations in the frame section of FIG. 2.

FIG. 8 better illustrates the relationship between the orientation of a Cartesian coordinate system 47 in which the unidirectional fiber tows or tapes laid down in a ply stack 50, and a polar coordinate system that defines the contour of the frame section 36. The contour of the frame section 36, designated by the numeral 37, may be defined by a radial coordinate "r" originating from a pole 39 and forming a polar angle θ with respect to a reference coordinate indicated by 0 degrees. Thus, each contoured feature by the frame section 36 may be defined by a value "r" (radial coordinate) at an angle θ. It should be note here that although the illustrated frame section 36 has a constant radius (curvature) and the web 42 has a constant gauge (thickness), the curvature of the frame section 36, the gauge of the web 42, the gauge of the inner chord 40 and the gauge of the outer chord 38 each may be variable along the length of the frame section 36.

In the illustrated example, the ply stack 50 is formed by multiple plies 52 in which the unidirectional pre-preg fibers are oriented within a Cartesian coordinate system 47 that is tangentially aligned with the radial coordinate "r". As will be discussed below in more detail, in the illustrated example, fiber orientations of 0 degrees, −45 degrees, +45 degrees and +90 degrees are employed, however other angular orientations are possible, depending on a variety of factors, including the particular application, and the geometry of the frame section 36.

Figure 9:
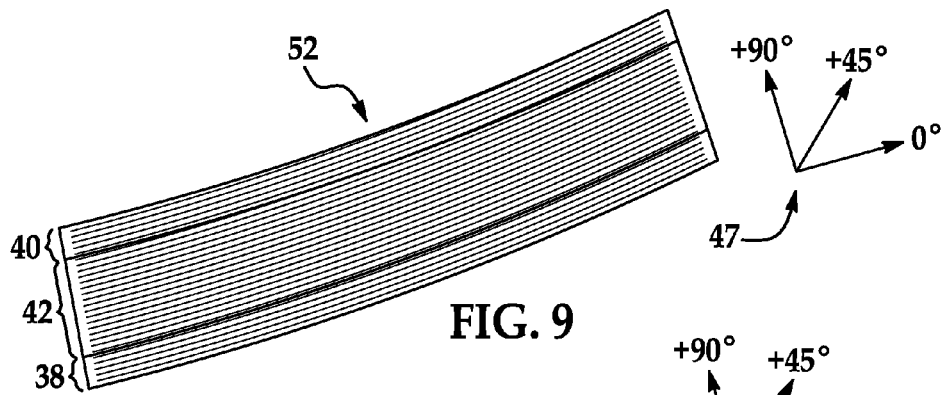
FIG. 9 is a plan illustration of a ply containing fibers oriented at 0 degrees.

Attention is now directed to FIGS. 9-12 which illustrate fiber orientation in several plies of a flat ply stack 50. FIG. 9 illustrates a ply 52 in which the tows or tape strips are laid down by the AFP machine 58 with a 0 degree orientation, extending the entire length of the frame section 36. As used herein, "tape" refers to preimpregnated unidirectional fibers, and "tows" may comprise tape that is slit along it length into narrow bands which may be, for example and without limitation, 0.125, 0.25 or 0.5 inches in width. A "course" refers to tows applied as a band by the AFP machine 58. "Drops" refer to the AFP machine 58 discontinuing one or more tows, and may comprise the distance between adjacent tows or tape. A cut/add convergent zone means that a course terminates at a course of different orientation within the same ply, thereby creating areas of gaps and overlaps.

The 0 degree plies 52 may be formed by using the AFP machine 58 to "steer" the laydown of slit tape in which conformability and drop-offs determine the width of the ply 52. A full ply 52 is illustrated in FIG. 9, however a partial ply or a ply with drop-offs is possible as well. The sections of the ply 52 which later will be formed into the outer chord, inner chord and web are respectively designated by the numerals 38, 40 and 42. It should be noted here that in some applications, the plies forming the outer chord 38 may be formed using a separate band of tows or layer of tape that is precut to width and placed on later discussed tooling, rather than being laid down using the AFP machine 58.

Figure 10:
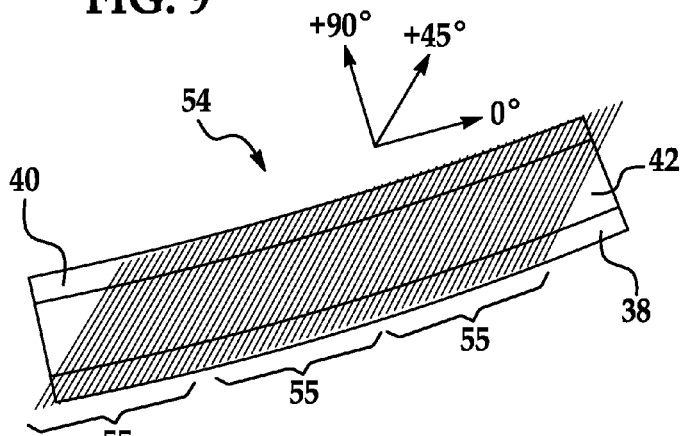
FIG. 10 is a diagrammatic illustration illustrating plies respectively containing fibers oriented at 45 and 90 degrees, and illustrating the use of tow and tape wedges.

The plies containing tows or tape oriented at angles other than 0 degrees are formed by side-by-side groups or segments 55, 74 of the tows/tapes that each has a tapered wedge shape. The segments 55, 74 may be formed using tape with up angle and drop allowance which determines the sides. For example, FIG. 10 illustrates a ply 54 formed by segments 55 in which the fiber orientation in each of the segments 55 is generally +45 degrees.

Figure 11:
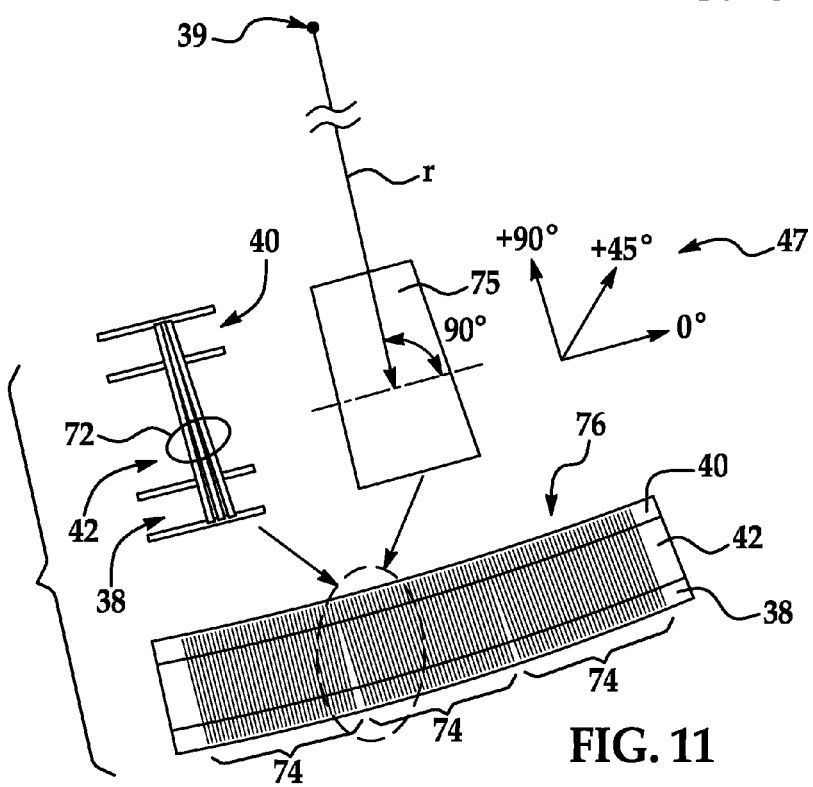
FIG. 11 is a perspective illustration of a flat stack of plies.

FIG. 11 illustrates a ply 76 formed by segments arranged side-by-side, in which the fibers in each segment 74 are oriented generally at 90 degrees, substantially aligned with the angle of the radial coordinate "r" defining the contour 37 (FIG. 8) of the frame section 36. Where tows 72 are laid down to form the segments 74, the individual tows are angled in the direction of the curvature of the ply 76. The angled tows 72 are individually placed in side-by-side relationship to each other. Alternatively, the segments may be formed by tapered wedges 75 of fiber tape that are laid down in side-by-side relationship to each other by the AFP machine 58 or a similar apparatus.

Figure 12:
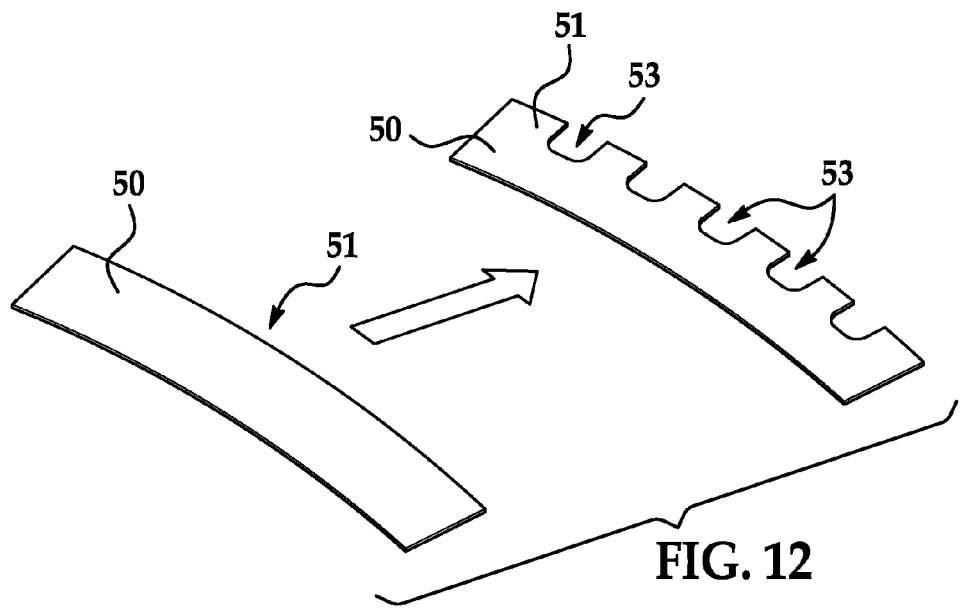
FIG. 12 is a perspective illustration similar to FIG. 11 but showing cut outs having been formed along one edge of the ply stack.

Referring now to FIG. 12, after the flat ply stack 50 has been fully placed, mousehole cutouts 53 may be created along one edge 51 of the ply stack 50. The cutouts 53 may be created using any of various techniques such as, by way of example and without limitation, using an NC controlled ultrasonic cutter (not shown).

In the illustrated example, the cutouts 53 provide openings through which the stringers 32b extend (FIG. 1). However, in other applications it may be desirable to provide similar cutouts 53 to reduce weight and/or reduce the possibility of ply wrinkling during subsequent fabrication processes.

Attention is now directed to FIGS. 13-17 which illustrate the formation of the inner chord 40 using a drape forming process. The ply stack 50 is placed on the upper flat surface 80a of a forming mandrel 80. The forming mandrel 80 includes a curved or contoured surface 80b which, in the illustrated example, forms a substantially 90 degree angle relative to the upper flat surface 80a. Any 0 degree plies that may be used to form the inner chord 40 are placed directly on the contoured surface 80b. An outer edge 50a of the ply stack 50 extends past the curved surface 80b and may be supported during ply placement by a layup shelf 86 that is subsequently moved to the position shown in FIG. 13. The forming mandrel 80 is supported on a vacuum bag tool 84, separated by a fiberglass breather 82. A vacuum bag 88 is placed over the ply stack 50 and forming mandrel 80. A breather 90 and a layer 92 of FEP (fluorinated ethylene propylene) may be placed between the bag 88 and the ply stack 50. The bag 88 can also have channels (not shown) on its inner surface, in which case the breather 90 is not required.

Figure 13:
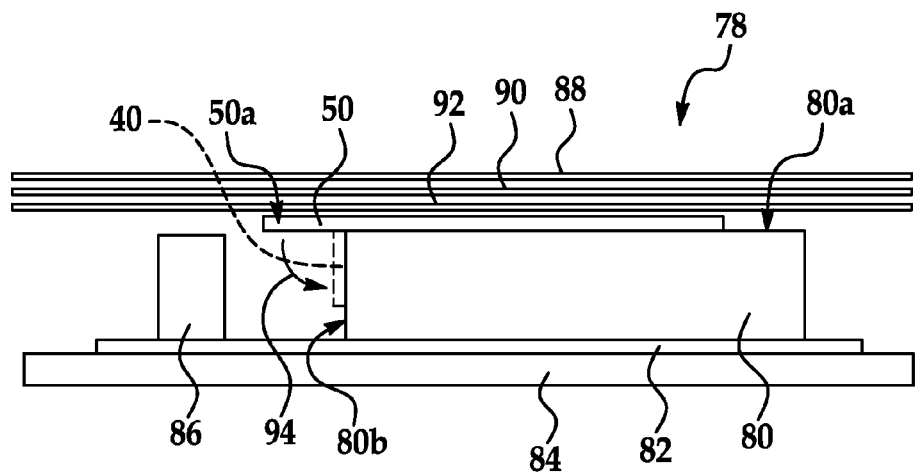
FIG. 13 is a cross sectional illustration showing a drape forming apparatus used to drape form an inner chord of the frame section.
Figure 14:
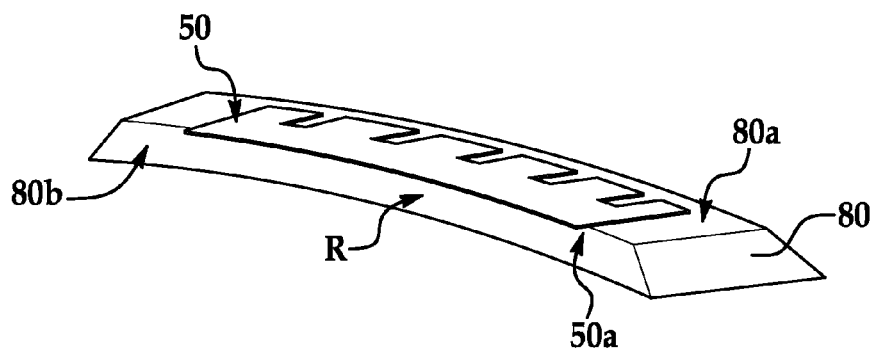
FIG. 14 is a perspective illustration of a flat ply stack positioned on a forming mandrel comprising part of the drape forming apparatus of FIG. 13.
Figure 15:
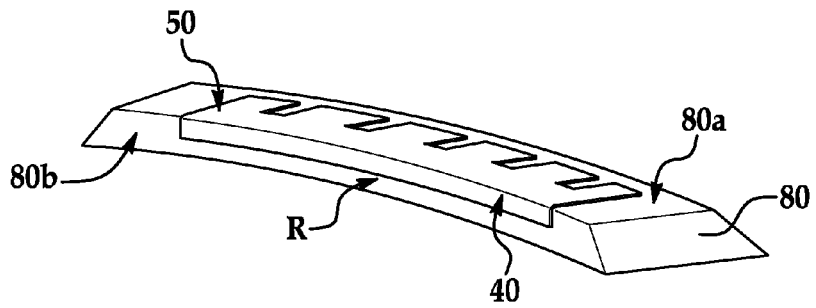
FIG. 15 is an illustration similar to FIG. 14 but showing the inner chord having been fully formed around the forming mandrel.

With the edge 50a of the ply stack 50 draped over the tool surface 80b, a vacuum is drawn in the bag 88 which applies pressure to the ply stack 50, causing the edge 50a to bend downwardly in the direction of the arrow 94 in FIG. 13 until the edge 50a lies substantially flat against and substantially assumes the contour of the curved surface 80b of the forming mandrel 80. A ply stack edge 50a is thus formed into the inner chord 40 having a radius substantially identical to the radius R of the curved tool 80b.

Figure 16:
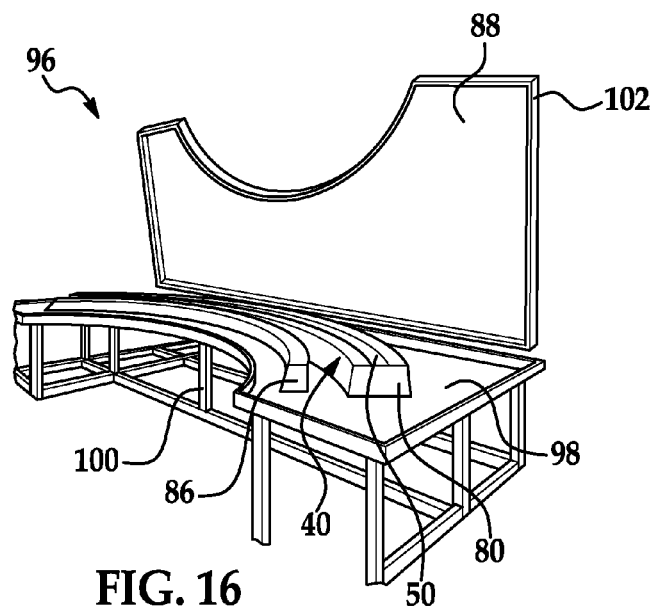
FIG. 16 is a perspective illustration of drape forming apparatus with a flexible membrane swung to an open position.
Figure 17:
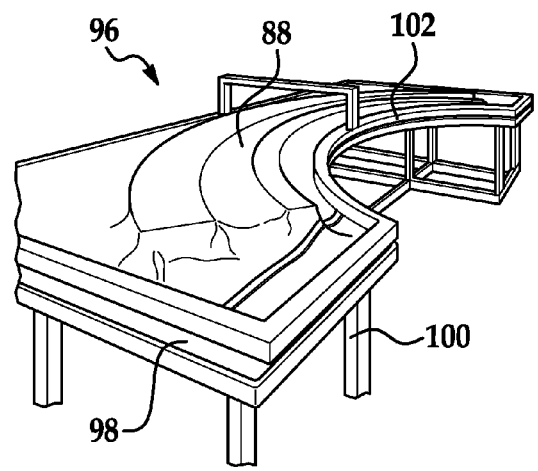
FIG. 17 is an illustration similar to FIG. 16 but showing the flexible membrane having been closed and drawn down around the tool assembly.

The forming process described above may be performed in a drape forming apparatus 96 shown in FIGS. 16 and 17. The bag 88 may comprise a gas impermeable membrane, formed, for example and without limitation, of silicone which is mounted in a frame 102 that is pivotally attached to a vacuum table 98 supported on legs 100. The vacuum table 98 includes ports or perforations (not shown) which allow air to be drawn through the table 98. The forming mandrel 80 along with the ply stack 50 and the layup shelf 86 may be placed on the vacuum table 98 with the frame 102 closed against the vacuum table 98.

As shown in FIG. 17, a vacuum system (not shown) may be used to evacuate the air in the sealed cavity formed by the frame 102 and table 98. Evacuation of this cavity results in the membrane 88 being drawn down over the forming mandrel 80, thus forming the edge 50a down over the front face 80b of the forming mandrel 80. The layup shelf 86 partially supports the membrane 88 during the formation process, thereby controlling and directing the force applied to the edge 50a of the membrane 88.

The inner chord 40 having been fully formed, the next step in the fabrication method is illustrated in FIGS. 18-21 in which the outer chord 38 is formed. The outer chord 38 may be fabricated by tension, hot drape forming using, for example and without limitation, the drape forming apparatus 124 shown in FIG. 19. The drape forming apparatus 124 includes a heated vacuum table 130 held in a lower frame 128 supported by legs 134. An upper, pivotal frame 126 includes a gas impermeable membrane 132 which may comprise silicone, for example. A tool in the form of a forming/cure mandrel 106 and a contoured block 112 are supported on the vacuum table 130 and are covered by the membrane 132 when the frame 126 is closed and sealed against the lower frame 128.

Figure 18:
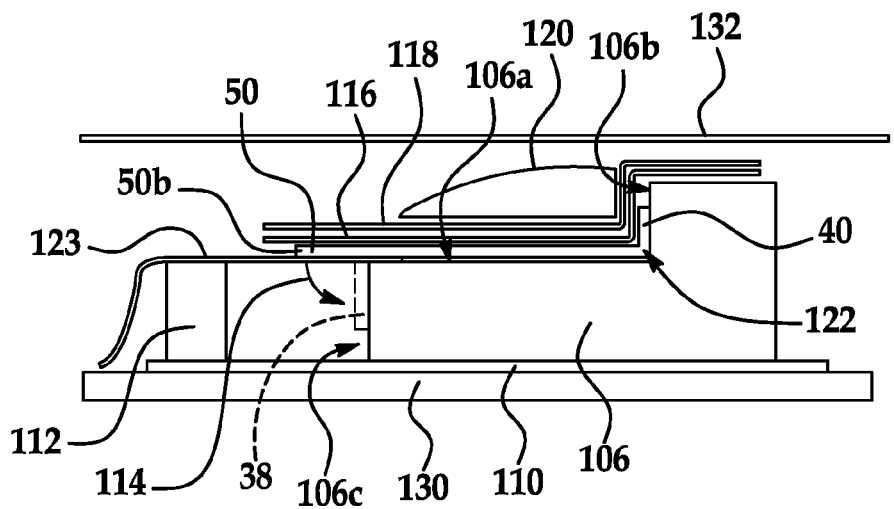
FIG. 18 is a sectional illustration of a hot drape forming apparatus for drape forming the outer chord of the frame section.
Figure 19:
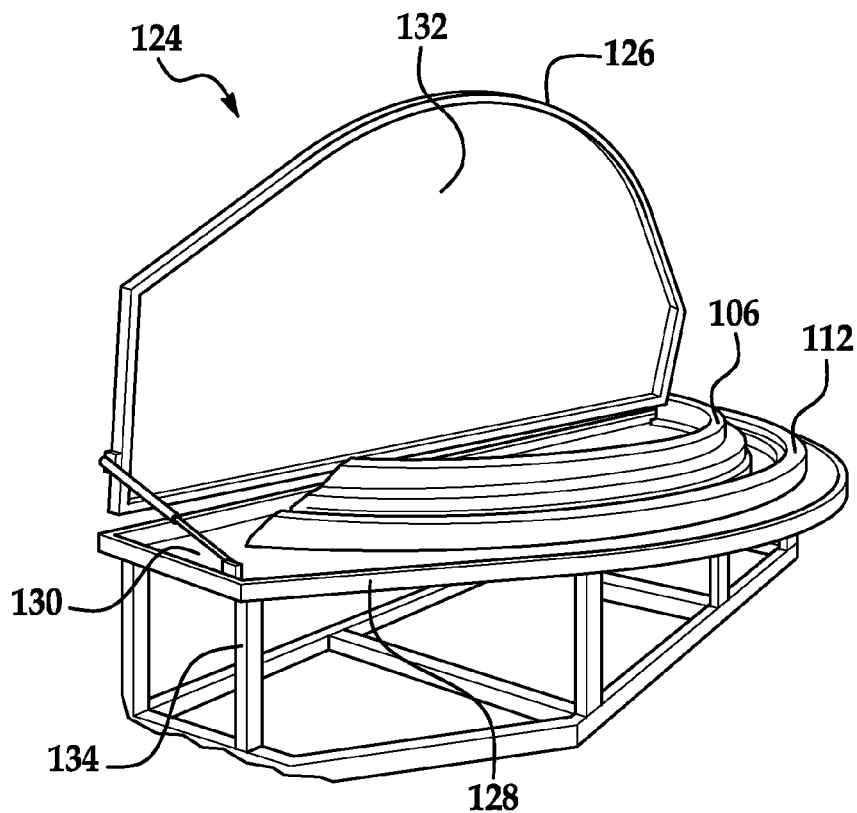
FIG. 19 is a perspective illustration of the hot drape forming apparatus shown in FIG. 18.

As best seen in FIG. 18, the forming/cure mandrel 106 includes a flat upper tool surface 106a which supports the ply stack 50. The second flat surface 106b on the forming/cure mandrel 106 extends upwardly from the tool surface 106a and engages the inner chord 40. The forming/cure mandrel 106 further includes a third surface 106c which extends downwardly from the tool surface 106a and is used to form the outer chord 38.

The forming/cure mandrel 106 is supported on the vacuum table 130. An optional breather 110 formed from fiberglass or other suitable material may be placed between the vacuum table 130 and the forming/cure mandrel 106. A contoured intensifier 120 may be placed over the ply stack in order to assure that the radius 122 is fully maintained adjacent the inner chord 40. A ply 116 of a material such, but not limited to Teflon® as well as a breather 118 may be placed between the intensifier and the ply stack 50. An additional layer 123 of FEP may be placed between an edge of the forming/cure mandrel and the ply stack 50. The FEP layer 123 is draped over the block 112, which in combination, function to control the angle at which the bag membrane 132 applies pressure to the outer edge 50b of the ply stack 50 during the drape forming process.

The outer chord 38 may be hot draped formed over the forming/cure mandrel 106 which may then be heated within an oven or by other means such as infrared lamps, to a preselected temperature for example, of approximately 140 degrees F. A vacuum is drawn in the bag membrane 132 and held for preselected periods of time. During the tension controlled hot drape forming process, the fibers can slide within a ply as a result of the viscosity of the matrix resin decreasing due to heating. This allows the fibers to bunch or spread, or otherwise rearrange themselves, as needed. Maintaining tension under the stack 50 minimizes wrinkling. The radius intensifier 120 holds the inner chord radius 122 (40*a* in FIG. 3) while forming the outer chord 38.

Figure 20:
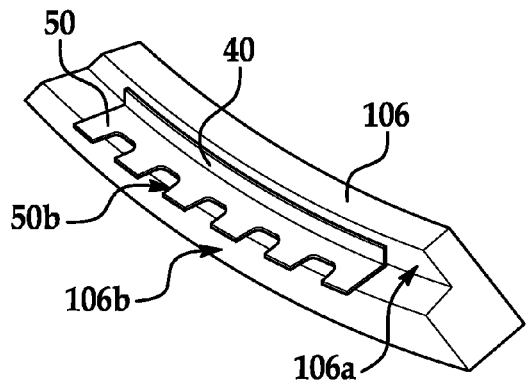
FIG. 20 is a perspective illustration of a forming/cure mandrel which comprises part of the drape forming tool assembly of FIG. 18, and depicting the partially formed frame section positioned thereon.
Figure 21:
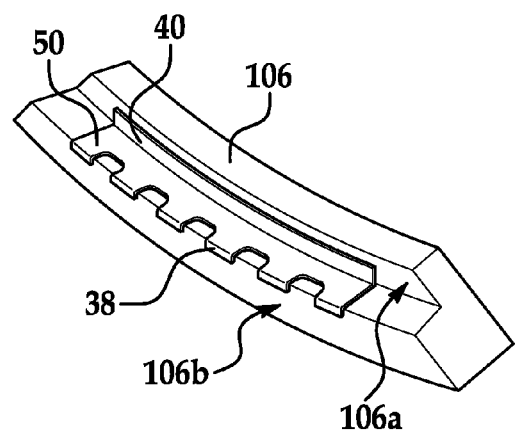
FIG. 21 is an illustration similar to FIG. 20 but showing the outer chord having been fully formed over the forming/cure mandrel.

FIG. 20 illustrates the partially formed ply stack 50 positioned on the forming/cure mandrel 106 with the formed inner chord 40 held against the tool surface 106*a*. The outer edge 50*b* of the ply stack 50 is cantilevered over the tool surface 106*b*. As shown in FIG. 21, when the membrane 132 is drawn down over the forming/cure mandrel 106, the membrane 132 applies pressure to the outer edge 50*b* at an angle that is partially controlled by block 112. The edge 50*b* of the ply stack 50 is then bent downwardly in the direction of the arrow 114 until it is fully formed against the tool surface 106*c* and forms the outer chord 38.

Figure 22:
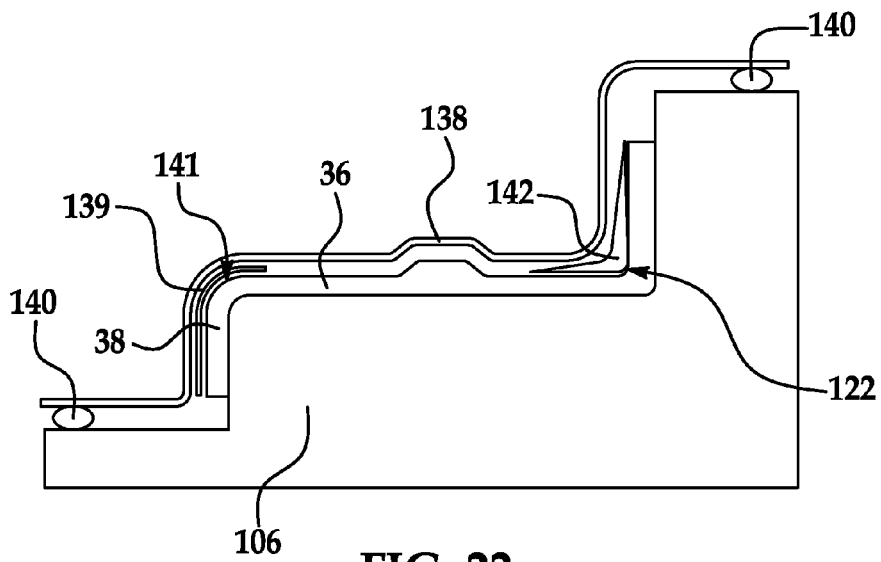
FIG. 22 is a sectional illustration of a forming/cure mandrel bag assembly used for curing the frame section.

When the outer and inner chords 38, 40 of frame section 36 having been formed, it is then necessary to cure the frame section 36, and in this connection, attention is directed to FIG. 22. The formed frame section 36 and forming/cure mandrel 106 are removed from the hot drape forming apparatus 124. A caul plate 139 may be placed over the outer chord 38 in order to assist in compacting the radius 141. Similarly, an intensifier 142 may be installed in order to aid in the compaction of the radius 122. A conventional vacuum bag 138 is placed over the frame section 36 and sealed by a seal 140 to the cure mandrel 106. A breather (not shown) and a peel ply (not shown) of FEP may also be placed between the forming/cure mandrel 106 and the bag 138.

Figure 23:
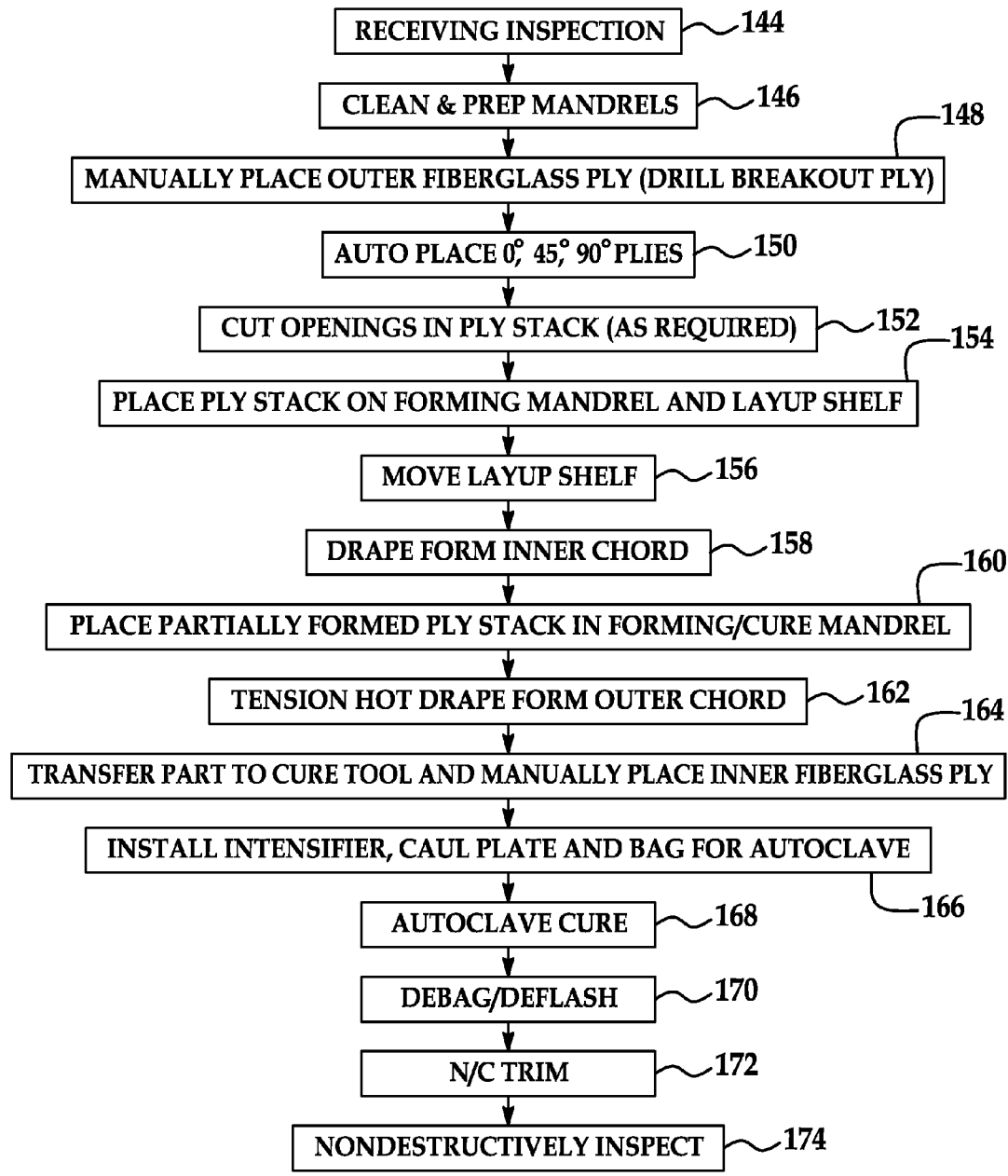
FIG. 23 is a flow diagram illustrating a method for fabricating continuous, contoured composite structures.

Attention is now directed to FIG. 23 which illustrates the overall steps used in the method for producing contoured composite structures. Raw materials, including pre-preg fiber tows and/or tape are received and inspected at 144. At 146, the previously discussed forming mandrel 80, and the forming/cure mandrel 106 are cleaned and prepared. Next, at 148, an outer fiberglass ply may be placed over the forming mandrel 80.

At step 150, all of the various plies in the stack 50 are laid down using one or more AFP machines 58. The flat ply stack 50 having been formed, the mousehole cutouts 53 are then put in the ply stack 50, as required at step 152. Next, at step 154, the ply stack 50 is placed on the forming mandrel 80 and layup shelf 86. Then at 156, the layup shelf 86 is moved to a position where it is used in the subsequent forming process. At step 158, the inner chord 40 is formed using the drape forming technique described above.

At step 160, the partially formed ply stack 50 is placed in the forming/cure mandrel 106. At 162 the outer chord 38 is hot draped formed on the forming/cure mandrel 106. Next, at step 164, the formed frame section 36 is transferred to the cure tool 106 and an inner fiberglass ply is placed over the frame. Next, at 166, the caul plate 139 and the intensifier 142 are installed, following which the assembly is vacuum bagged in preparation for autoclave curing. At 168 the frame section 36 is cured in an autoclave (not shown) following which, at 170, the cured, fully formed frame section 36 is debagged and deflashed. The frame section 36 may be trimmed at 172 using a numerically controlled cutter and the trimmed frame section 36 may then be inspected at 174 using conventional nondestructive evaluation techniques.

Figure 24:
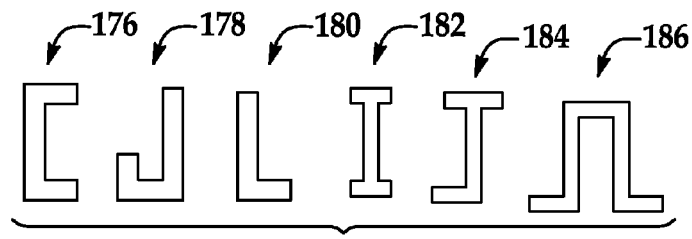
FIG. 24 illustrates cross sectional geometries of continuous composite structures that may be formed according to the disclosed embodiments.

While the disclosed embodiments illustrate use of the method to fabricate a contoured composite structure having a Z-shaped cross section, various other contoured structures are possible in which one or more legs extend outwardly from a structural feature such as a web. For example, as shown in FIG. 24, the disclosed embodiments may be employed to fabricate contoured, continuous structures having other leg configurations or cross sectional shapes, such as, without limitation, a C shape 176, a J shape 178, an L shape 180, an I shape 182, a modified J shape 184 and one or more forms of a U shape 186.

Figure 25:
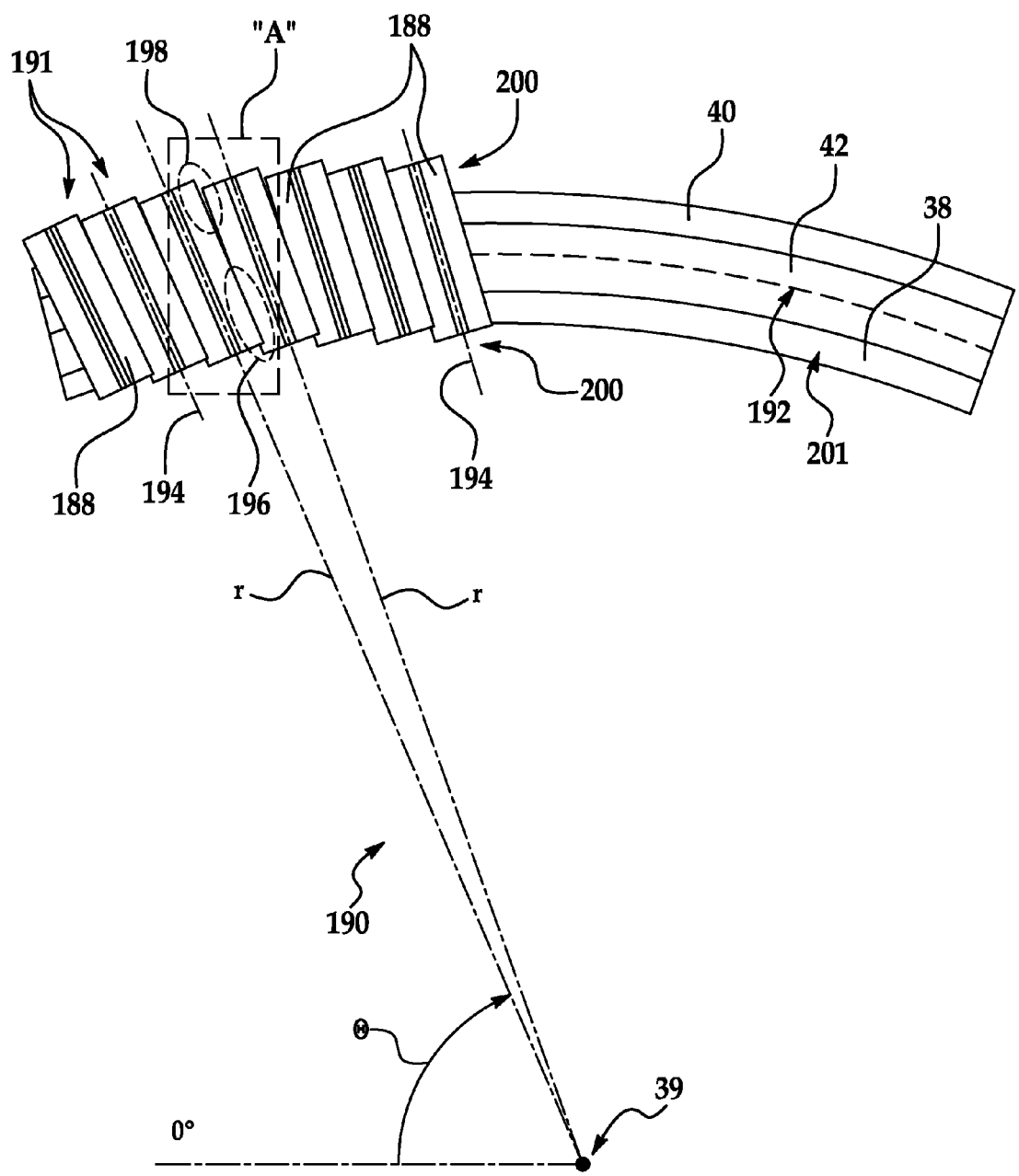
FIG. 25 illustrates a plan view of tape segments being placed on a substrate in relation to their alignment in a polar coordinate system.
Figure 26:
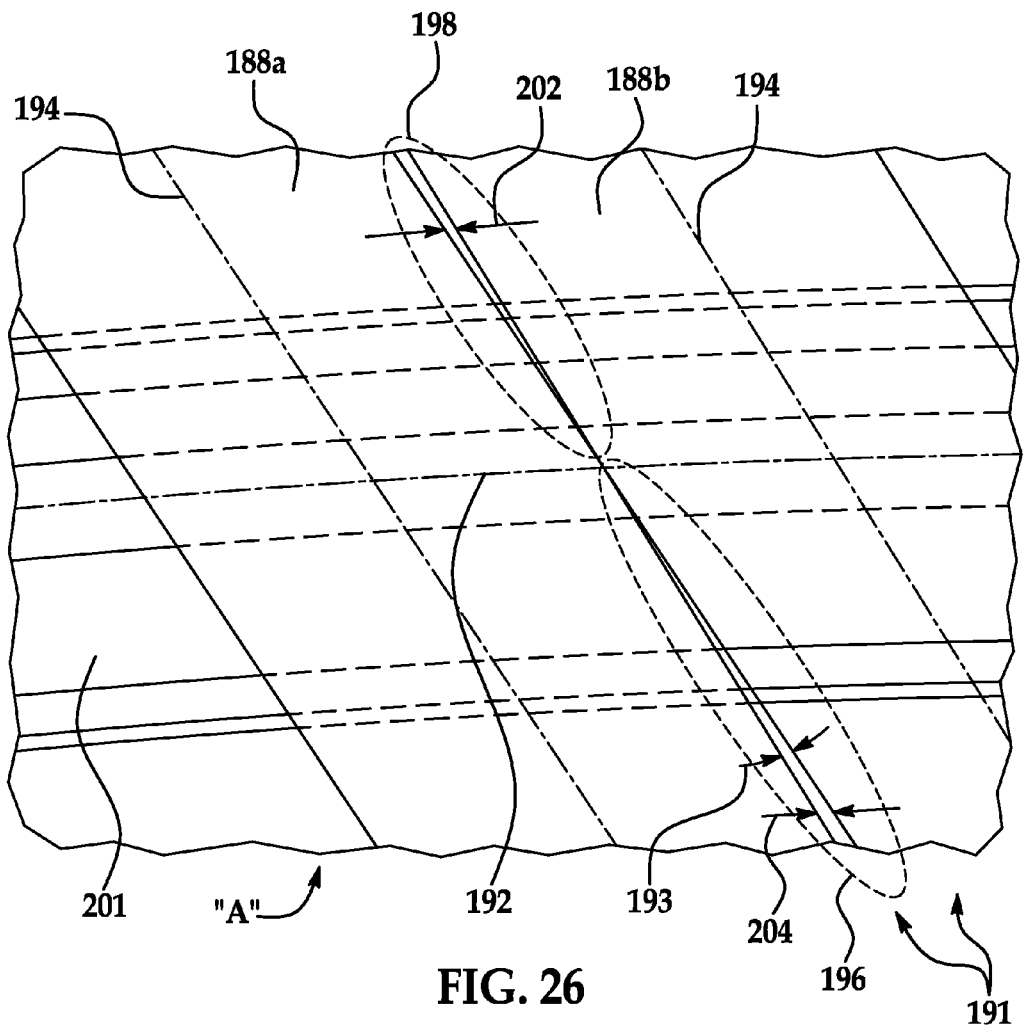
FIG. 26 is an enlarged illustration of the area designated as "A" in FIG. 25.

Attention is now directed to FIGS. 25 and 26 which illustrate another method for laying up a contoured ply 201 using overlapping ply segments 188 formed of substantially constant width, unidirectional pre-preg fiber tape. The constant width ply segments 188 may be cut from tape drawn from a spool (not shown) of standard or non-standard width tape. In the example shown in FIGS. 25 and 26, the ply segments 188 are substantially rectangular in shape, however, they may have other shapes, providing that the ply segments 188 have substantially the same widths. The ply segments 188 are placed on a substrate (not shown) and arranged along the contoured centerline 192 of a contoured ply 201 being laid up. Each of the ply segments 188 extends radially beyond the inner and outer chords 38, respectively, to form extensions 200 that are later trimmed so that the full ply 201 formed by the ply segments 188 substantially matches the contour of the structure 36 (FIG. 2).

Each of the ply segments 188 includes a longitudinal centerline 194 that is aligned during the placement process with a radial coordinate "r" originating from a pole 39 in a polar coordinate system 190. Each of the centerlines 194, sometimes also referred to herein as an axis of curvature, form an angle θ relative to a reference line shown as "0°" in FIG. 25. The polar coordinate system 190 is used to define one or more contours of the structure 36 (FIG. 2). According to the disclosed embodiments, the constant width tape segments 188 are placed in overlapping relationship 191 relative to each other such that the amount of overlap is preferably held substantially constant. As each ply segment 188 is placed, it is oriented at a slight angle 193 (FIG. 26) from the previously placed, adjacent segment 188. Placing the ply segments 188 in overlapping relationship 191 results in adjacent ones of the ply segments 188*a*, 188*b* forming a pie-shaped lap 196 near the inner chord 40, and a pie-shaped gap 198 adjacent the outer chord 38. The laps 196 and gaps 198 can be adjusted to meet structural requirements of a particular application by changing the width of the tape segments 188. The constant width tape layup method described above allows layup of non-zero plies at a relatively fast rate, even on small, highly contoured composite structures.

As best seen in FIG. 26, the lap 196 generally extends from the centerline 192 of the ply 201 in which the width 204 of the lap 204 grows progressively larger with increasing distance from the centerline 192. Similarly, the width 202 of the gap 198 between adjacent ply segments 188*a*, 188*b* grows larger with increasing distance from the centerline 192. According to the disclosed embodiments, both the laps 196 and the gaps 198 are substantially minimized. In contrast to the periphery cut tape segments used in the embodiment shown in FIG. 11, the use of simple, end cut ply segments 188 of constant width facilitate the use of automated equipment (discussed below) to place the ply segments 188 in a predetermined manner that minimizes the laps 196 and gaps 198.

The overlapping placement of constant width ply segments 188 as described above results in a ply 201 having substantially evenly displaced discontinuities defined by the laps 196 and gaps 198.

The width chosen for the tape segments 188 will vary with the application. Narrower tape segments 188 can be utilized in order to reduce the lap 196 and/or the gap 198. Similarly, wider tape widths may be employed to increase the lay-down rate. Laps 196 and gaps 199 for 45 degree plies 201 can be reduced by changing the ply segments 188 to a+/−60 degree orientations.

Figure 27:
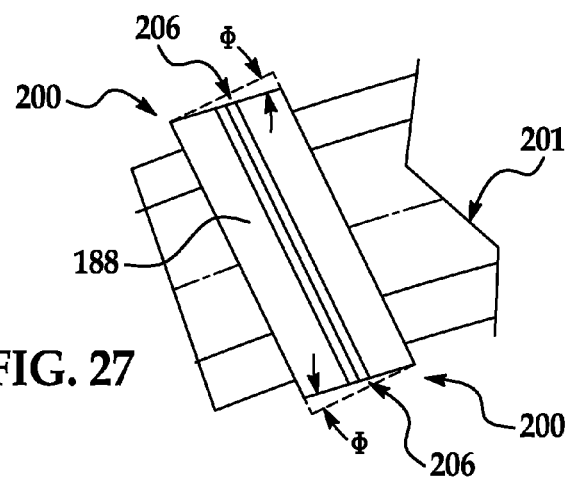
FIG. 27 is a plan view illustration of a single tape segment showing an alternate end cut.

Referring to FIG. 27, the overlapping ends 200 of each tape segment 188 may be cut at 206, at an angle θ so as to substantially match the outer contours of the inner chord 40 and the outer chord 38, respectively. The cut ends 206 of the segments 188 therefore may substantially follow the contour of the structure 36 (FIG. 2), resulting in the segment 188 having a generally trapezoidal shape.

Figure 28:
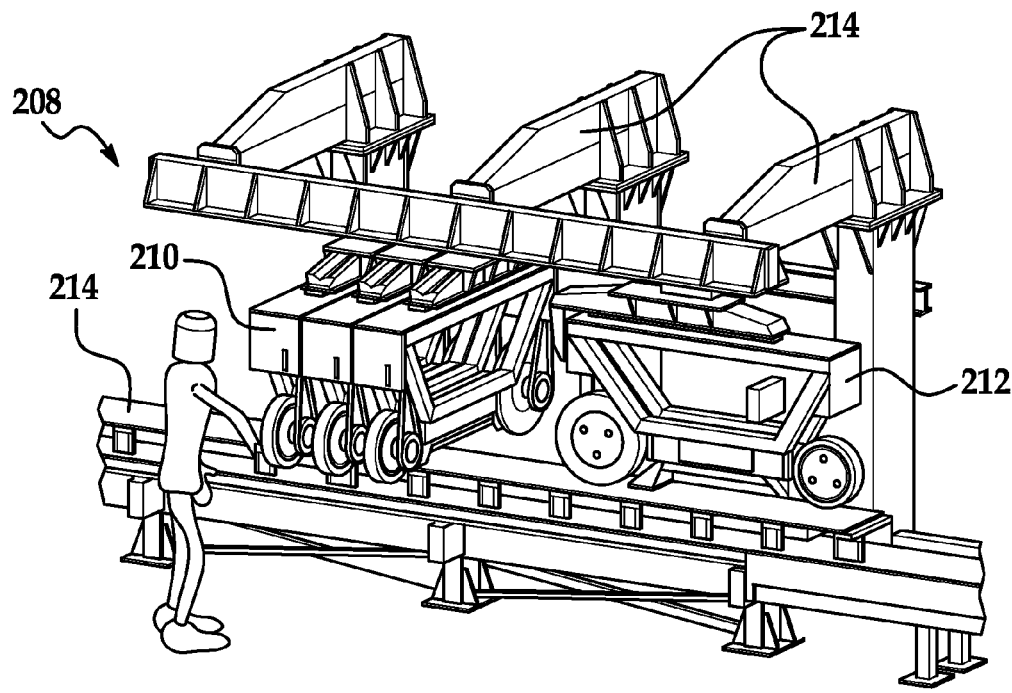
FIG. 28 is a perspective illustration of an automatic tape placement machine.

In accordance with the disclosed embodiments, each of the ply segments 188 may be placed on a substrate (not shown) using automatic tape placement equipment 208 shown in FIG. 28 which aligns the centerlines 194 (FIGS. 25 and 26) in polar orientations related to the contour of the structure 36 (FIG. 2). Referring to FIG. 28, the automatic tape placement equipment 208 includes pivotal tape placement heads 210, 212 mounted on a gantry 214 for pivotal motion relative to the contour of a substrate 214, which may be a tool. Each of the heads 210, 212 includes a supply of composite tape (not shown) along with cutting and placement mechanisms (not shown) that cut the tape to length and place the cut lengths of tape on the substrate 214. The tape heads 210, 212 and/or the substrate 214 are moved relative to each other so that the tape heads 210, 212 traverse across the substrate 214 and place composite tape automatically, typically under the control of a CNC controller (not shown). Additional details of a suitable automatic tape placement machine 208 are disclosed in U.S. Pat. No. 7,137,182 issued Nov. 21, 2006, the entire contents of which are incorporated by reference herein.

Figure 29:
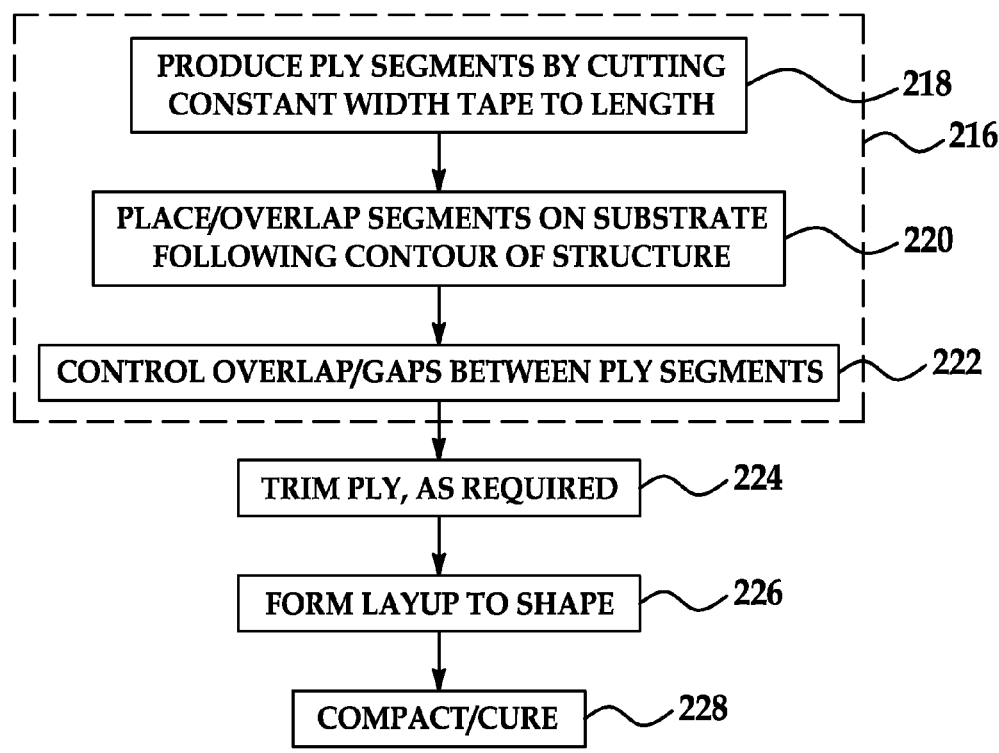
FIG. 29 illustrates a flow diagram of a method of fabricating a contoured composite structure using constant width tape segments.

Attention is now directed to FIG. 29 which illustrates the overall steps of method for making a contoured composite structure having one or more legs. A ply 201 is laid in a series of steps 216 that begin at 218, with the production of the ply segments 188 by cutting constant width, unidirectional fiber pre-preg tape to the desired lengths. Next at 220, the ply segments 188 are placed on a substrate in side-by-side, overlapping relationship which follows the contour of the composite structure. During the placement process, the longitudinal centerlines 194 of the ply segments 188 are aligned in a polar orientation related to the contour of the structure. At 222, the overlap 196 and gaps 198 between adjacent ply segments 188a, 188b is controlled. Typically, this control is implemented automatically when using automated tape placement equipment, of the type shown in FIG. 28.

At 224, each complete ply 201, or a stack of plies 201 may then be trimmed to final shape, as required. At 226, the completed ply stack 50 (FIG. 8) may be formed to shape using techniques previously described herein, which may include forming one or more legs. Finally, at 228, the shaped ply stack 50 may be compacted and cured.

As previously discussed, it may be necessary in some applications where the contoured composite structure such as the frame section 36 shown in FIGS. 1 and 2, has a relatively substantial curvature, to place the zero degree plies 52 (FIG. 9) on the inner and outer legs 40, 38 after they have been formed. This process requirement stems from the fact that the fibers in the zero degree plies 52 (FIG. 9) are substantially inextensible, i.e. they will not substantially change in length by stretching during forming from a smaller radius to a larger radius. Similarly, the fibers in zero degree plies 52 may not substantially change in length through compression during forming from a larger radius to a smaller radius. Thus, when formed from a larger radius to a smaller radius, the zero degree plies may buckle, bridge, wrinkle and/or wave since the zero degree fibers may not readily slide over each other during forming to allow the fibers to remain substantially in-plane. Consequently, the fabrication methods previously described to form contoured composite structures require a multi-step process for placing the zero degree plies 52, unlike placement and forming of the non-zero degree plies.

Figure 30:
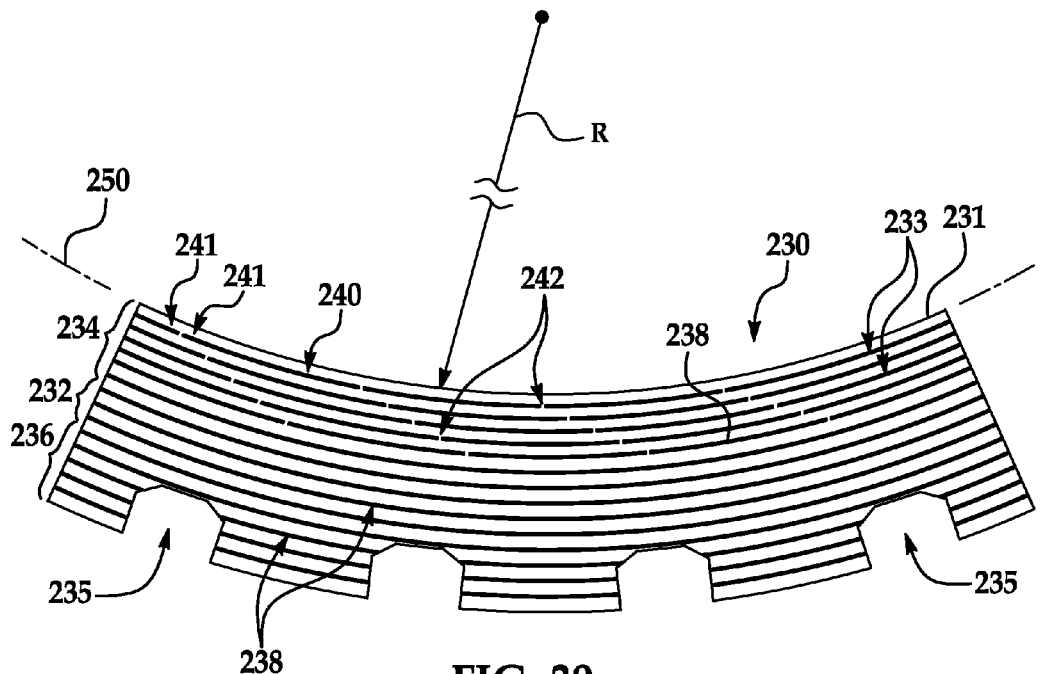
FIG. 30 is an illustration of a flat composite charge having a zero degree ply, prior to forming.

According to an alternate method of fabricating a contoured composite structure 36 (FIGS. 1 and 2) discussed below however, a flat stack or charge 50 (FIGS. 5 and 21) containing one or more zero degree plies 52 may be formed into one or more curved legs 38, 40 in a single forming operation, thereby obviating the need for placing the zero degree plies 52 on the legs 38, 40 in a separate step after the legs 38, 40 have been formed. Referring to FIG. 30, a flat, multi-ply prepreg fiber charge 230, sometimes also referred to herein as a stack 230, includes a zero degree ply 231 placed thereon. Similar to the flat charges previously discussed, charge 230 may include a plurality of non-zero degree plies (not shown in FIG. 30) that are laid up according to the previously discussed methods using a polar coordinate system to align portions of each of the plies relative to the axis of curvature 250 of the contoured structure 36 defined by a radius of curvature R.

The flat charge 230 includes a central web portion 232, an inner leg portion 234 and an outer leg portion 236 which are respectively formed into the web 42, inner chord or leg 40 and outer chord or leg 38 of the contoured composite structure 36 shown in FIG. 2. The charge 230 may or may not include cutouts 235 as previously described which accommodate stringers 32 (FIG. 1) or other structural features. In this example, the web portion 32 and the outer leg portion 236 on the zero degree ply 231 are formed by continuous slit tape tows 238, referred to hereinafter as continuous tows 238. However, the inner leg portion 234 of the zero degree ply 231 is formed by a series of side-by-side strips 233 of tow segments 240 formed by selectively cutting continuous tow material "on-the-fly" into tow segments 240 that are placed end-to-end, either by hand, or by using an AFP machine 58 (FIG. 7). In this example, the ends 241 of adjacent tow segments 240 are slightly spaced apart to form gaps 242 between the tow segments 240 in each strip 233. However, as will be discussed below, the ends 241 of adjacent tow segments 240 may abut each other or may overlap each other prior to the charge 230 being formed. During placement, the continuous tows 238 and the strips 233 of tow segments 240 are steered as they are being placed so that they are aligned with the axis of curvature 250.

Figure 31:
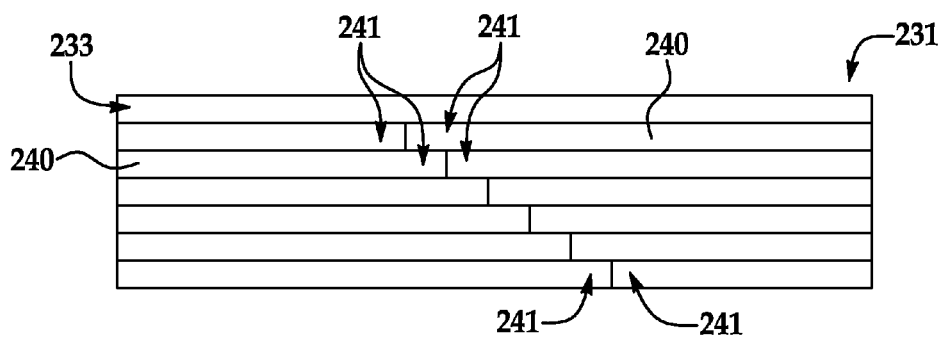
FIG. 31 is an illustration of a plan view of a portion of a zero degree ply illustrating one technique for staggering the tow segments.
Figure 32:
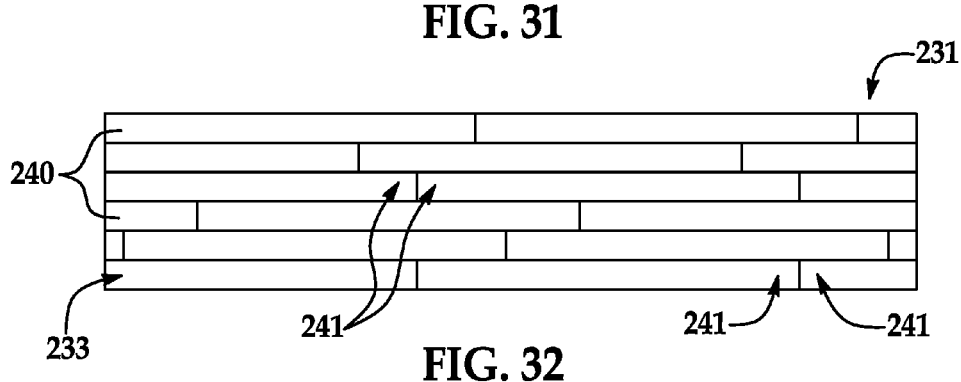
FIG. 32 is an illustration similar to FIG. 31 but showing an alternate technique for staggering the two segments.

FIG. 31 illustrates a zero degree ply 231 in which the adjacent ends 241 of the tow segments 240 in each strip 233 are arranged in a staggered pattern in which the meeting of the adjacent ends 241 occurs at successively greater distances. Staggering the segments 240 in this manner reduces any adverse effect on the cured structure's compression, tension and shear strength. FIG. 32 illustrates an alternate staggering pattern in which meetings of adjacent ends 241 of the tow segments 240 are somewhat randomly distributed from strip to strip 238, but wherein none of the meetings between the adjacent ends 241 are aligned with each other.

Figure 33:
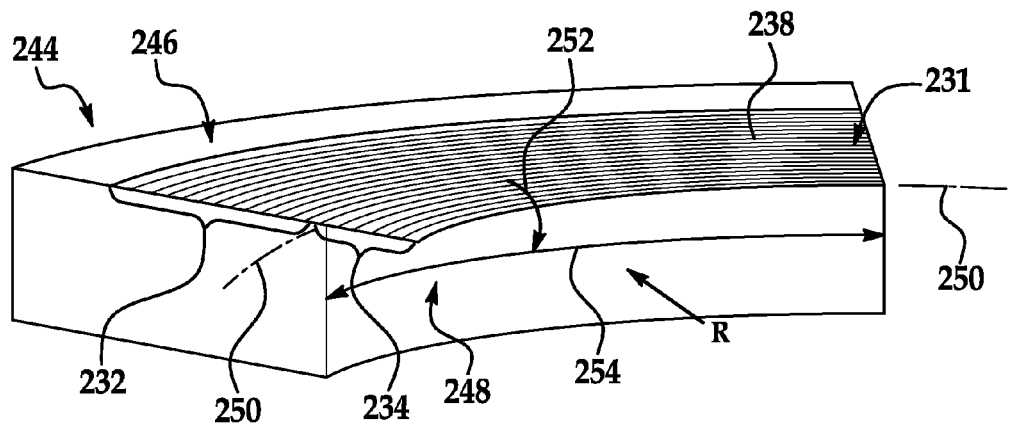
FIG. 33 is an illustration of a perspective view of a forming tool having a curved, zero degree ply placed thereon.
Figure 34:
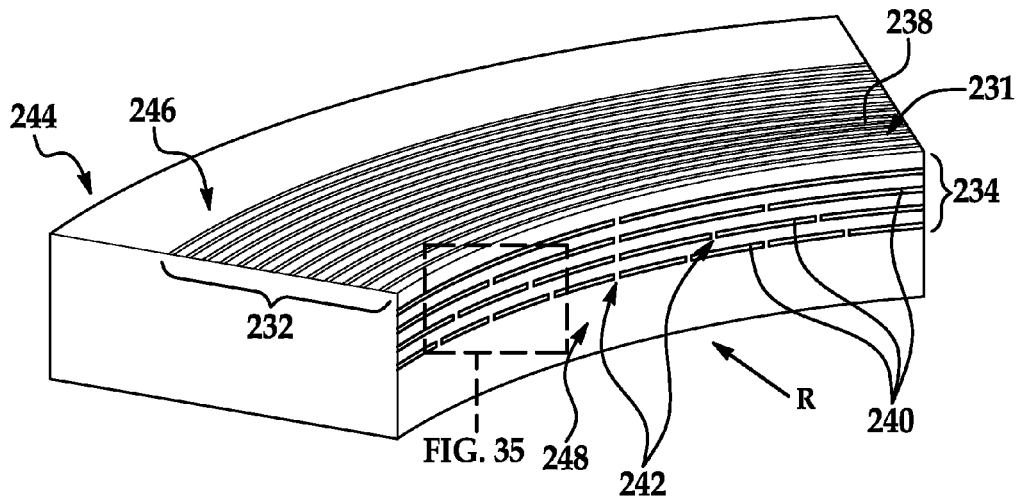
FIG. 34 is an illustration similar to FIG. 33 but showing a portion of the ply having been formed over a concave surface the tool to produce a curved leg.

Referring now to FIGS. 33 and 34, a curved forming tool 244 includes a curved upper tool surface 246 and a contiguous concave tool surface 248 having a radius of curvature R and an arc length 254. For simplicity of illustration, only a single zero degree ply 231 is shown being formed on the tool 244, however it will be understood that ply 231 forms part of the multi-ply charge 230 similar to that shown in FIG. 30 but not having an outer leg portion 236 or cutouts 235. A web portion 232 of the ply 231 contains continuous tows 238 having a zero orientation relative to the axis of curvature 250 of the tool 244. An inner leg portion 234 of the ply 231 comprises a series of side-by-side strips 233 of tow segments 240 and is formed down over the concave tool surface 248, in the direction shown by the arrow 252.

During the forming process, the fibers in the tow segments 240 in the leg portion 234 may slide relative to each other into a best fit shape so as to better conform the leg portion 234 to the concave tool surface 248 without substantial buckling, bridging, wrinkling and/or waving. Cutting the tows into tow segments 240 in the leg portion 234 of the charge 230 allows the fibers in the leg portion 234 to effectively change length by separating or overlapping, thereby relieving any induced compression and/or tension in the fibers, as the flat charge 230 undergoes a geometric transition from a flat shape to a contoured shape matching the concave tool surface 248. Generally, the technique of selectively cutting the tow material into tow segments 240 that are placed end-to-end may be used to lay down zero degree fibers on any portion of a flat charge 230 where the fibers are theoretically required to change their lengths during forming to remain flat and in-plane.

Figure 35:
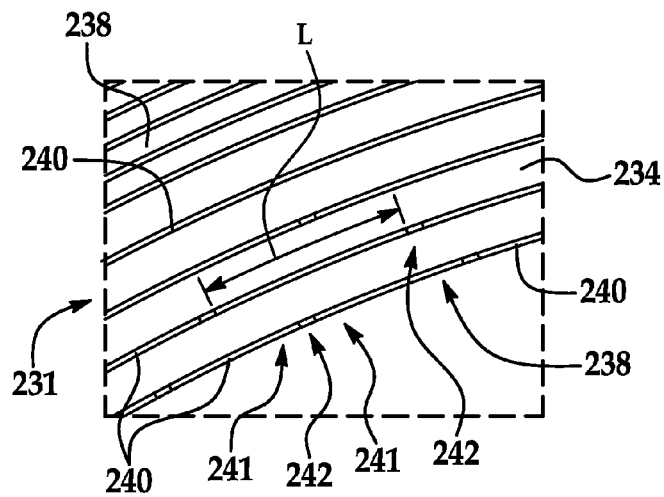
FIG. 35 is an illustration of the area designated as FIG. 35 in FIG. 34, showing variable length tow segments in the formed leg.
Figure 36:
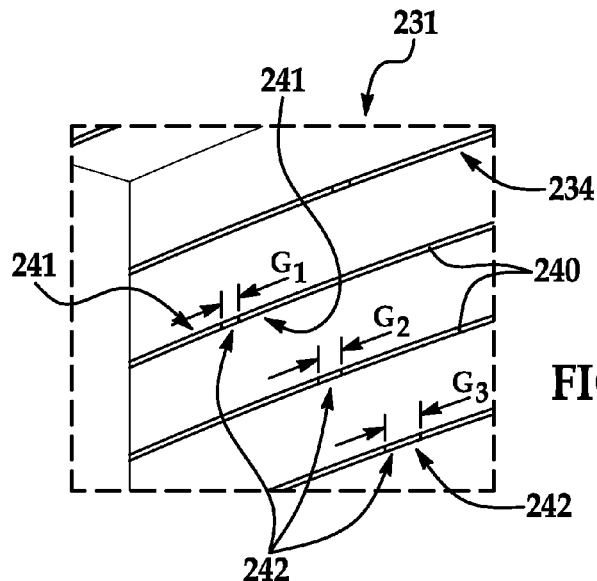
FIG. 36 is an illustration similar to FIG. 35 but showing variable width gaps between the tow segments.

As best seen in FIG. 35, the tow segments 240 may have an arc length L which may vary in order to achieve a maximum, preselected gap 242 between the tow segments 240 during forming. Based on a known structure radius R and a known tangent arc length 248 (FIG. 33), the smallest case tow segment arc length L can be calculated. As the radius R (FIG. 34) of a contoured structure increases, fiber length differentials from the web portion 232 to the formed leg portion 234 decrease and the fibers are less affected by tension and compression forces. Consequently, as the larger structure radiuses R are used, larger segment arc length L may be used. Alternatively, as shown in FIG. 36, it is possible to employ tow segments 240 that have a substantially constant length L but with variable segment-to-segment gaps $G_1$, $G_2$, $G_3$ that increase with increasing distance from the axis 250 about which the leg portion 234 is formed in order to assure that the tow segments 240 do not overlap during forming. The predetermined lengths L of tow segments are chosen based on the radius of curvature R of the contoured structure, maximum segment-to-segment gap G allowance and the concavity or convexity of the leg 234, the amount of leg discontinuity, i.e. joggles and ramps, the widths of tow being used and the interlaminar shear capability of the resin system. A segmented tow strategy is chosen so that the zero degree disjointing maximizes charge formability without degrading structural load carrying capability of the cured structure.

Figure 37:
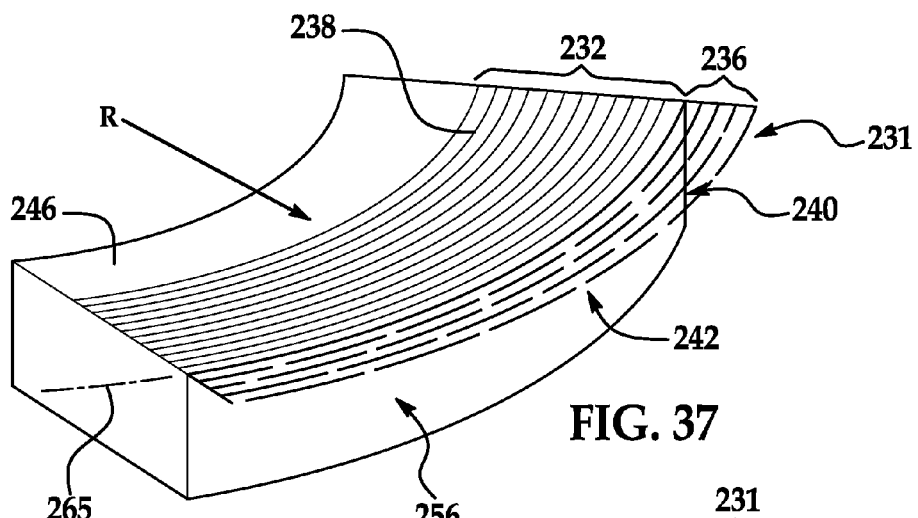
FIG. 37 is an illustration of a perspective view of a forming tool having a curved, zero degree ply placed thereon in preparation of forming a portion of the ply over a convex surface of the tool.
Figure 38:
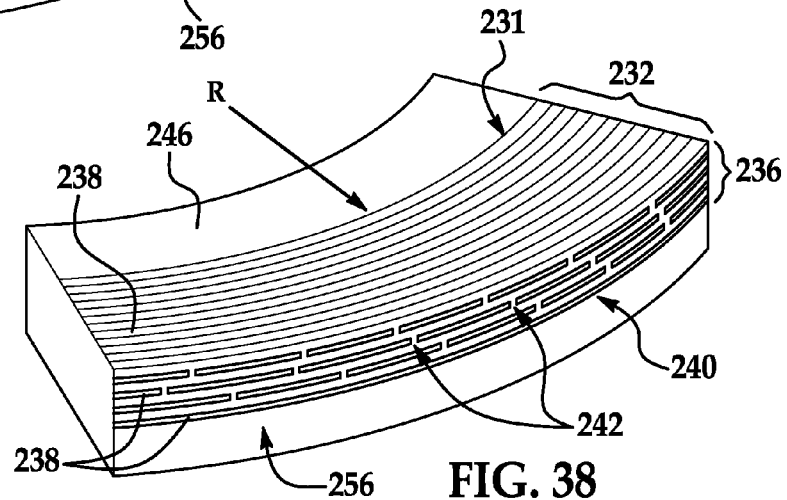
FIG. 38 is an illustration similar to FIG. 37 but showing the ply having been formed over the convex surface of the tool.

FIGS. 37 and 38 illustrate a tool 256 for forming an outer leg portion 236 of a zero degree ply 231 onto a concave surface 242 of the tool 256. In this example, the outer leg portion 236 of the zero degree ply 231 comprises tow segments 240 having a fixed arc length L (see FIG. 35) and segment-to-segment gaps 242. During forming of the outer leg portion 236 from a larger radius to a smaller radius onto the concave surface 242 of the tool 256, the segments 240 move toward each other due to compression of the outer leg portion 236, thereby reducing the size of the gaps and/or bringing the adjacent segments 240 into abutting or nearly abutting relationship to other, as shown in FIG. 38. Following formation onto surface 242, the size of the gaps 242, if any, may vary according to the distance of the segments 240 from the axis 265 about which the outer leg portion 236 is formed.

Figure 39A:
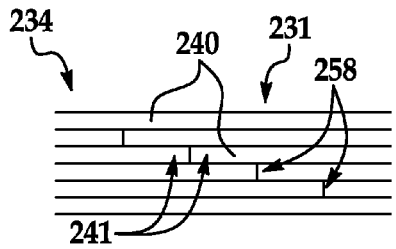
FIGS. 39A and 39B are illustrations of plan views of an inner leg portion of a zero degree ply, showing how butt joints between tow segments stretch apart to form gaps between the tow segments during forming.
Figure 39B:
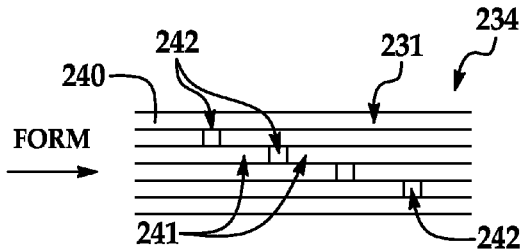

The size of the gaps 242 between adjacent ends 241 of the tow segments 240 in a leg portion 234, 236 following forming will depend on the spacing or overlap between the segments 240 as they are cut and placed on the flat charge 230. For example, FIG. 39A shows an inner leg portion 234 of a zero degree ply 231 in which the adjacent ends 241 of tape segments 240 abut or nearly abut at 258, but will spread during forming to create gaps 242 between the adjacent ends 241, as shown in FIG. 39B, as the leg portion 234 moves from a smaller radius to a larger radius. Depending upon the segmenting strategy used for a particular application, butts, gaps or overlaps between the ends 241 of the tow segments 240 can be created on either leg portion 234, 236.

Figure 40A:
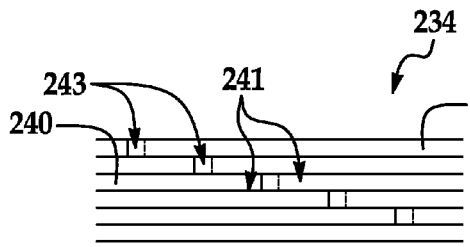
FIGS. 40A and 40B are illustrations similar to FIGS. 39*a* and 39*b*, but showing another segmenting strategy for an inner leg portion of a zero degree ply.
Figure 40B:
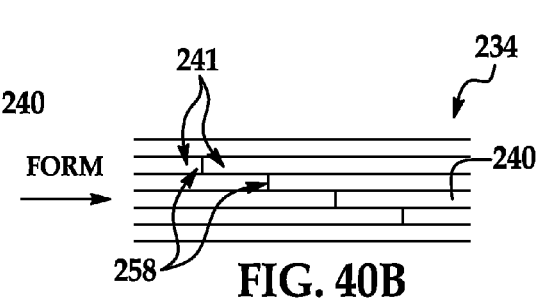

FIG. 40A illustrates another segmenting strategy that may minimize tow segment gaps 242 on an inner leg portion 234. Using this strategy, the ends 241 of adjacent tow segments 240 are placed such that they initially overlap at 243 prior to forming. During forming, however, the adjacent tow segment ends 241 move apart and may form butt joints 258, as shown in FIG. 40B.

Figure 40C:
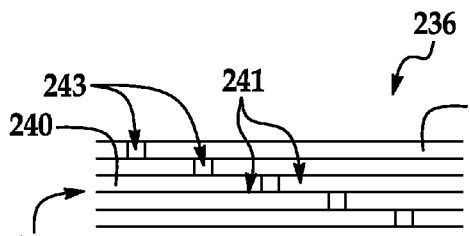
FIGS. 40C and 40D are illustrations of plan views of an outer leg portion of a zero degree ply, showing how spaced apart tow segments of a zero degree ply move toward each other.
Figure 40D:
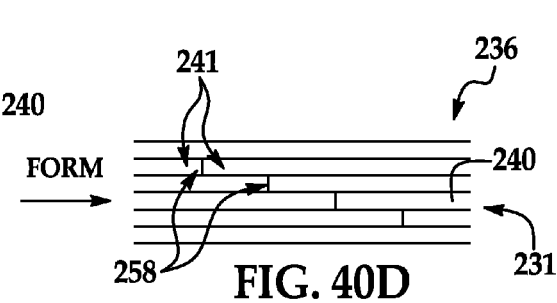

FIG. 40C illustrates shows an outer leg portion 236 of a zero degree ply 231 in which the adjacent ends 241 of tape segments 240 are laid down with segment-to-segment gaps 243 therebetween. During forming of the outer leg portion 236 from a larger radius to a smaller radius, the tape segments 240 move toward each other into abutting or nearly abutting relationship, as shown at 258 in FIG. 40D. Although not shown in the drawings, the segment-to-segment gaps 243 may be selected such that following forming of the outer leg portion 236, the adjacent ends 241 of the tape segments 240 may overlap each other.

Figure 41:
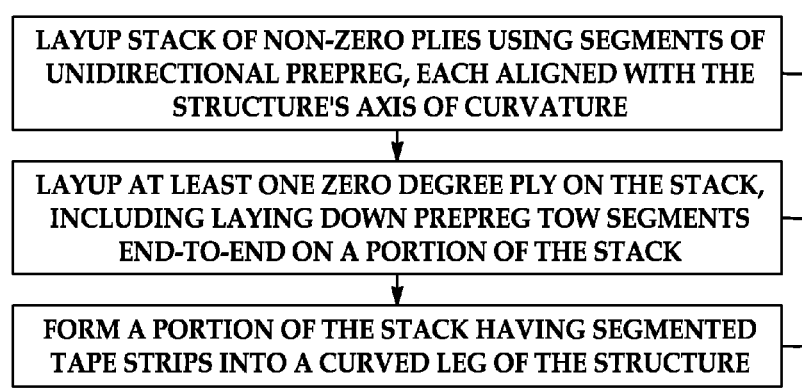
FIG. 41 is an illustration of a flow diagram of a method of forming a contoured composite structure having at least one curved using a flat charge that includes a zero degree ply.
Figure 42:
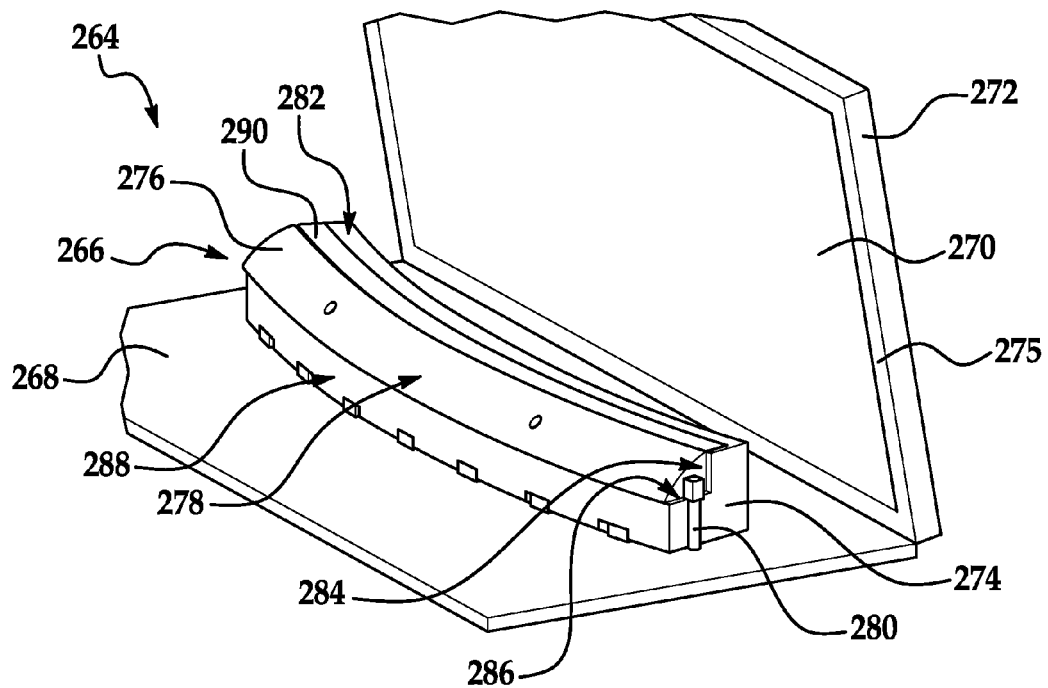
FIG. 42 is an illustration of a perspective view of apparatus for forming a contoured composite structure having two curved legs, the composite charge not shown.

Attention is now directed to FIG. 41 which broadly illustrates the steps of a method of fabricating a contoured composite structure 36 (FIG. 2) having at least one curved leg 38, 40 using a flat stack 230 of composite plies that includes at least one zero degree ply 231. At step 260, a flat stack 230 of non-zero plies are laid up using segments 188 (FIG. 25) of unidirectional prepreg, wherein each of the segments 188 is aligned with the structure's axis of curvature 250 which may be defined within a polar coordinate system 190 (FIG. 25). At 262, at least one zero degree ply 231 is laid up on the flat stack 230, including laying down segments of unidirectional prepreg tows, placed end-to-end on a portion 234, 236 of the stack 230 that is to be formed into a curved leg 38, 40 (FIG. 2). At step 262, the portion 234, 236 of the stack containing the tow segments 240 is formed into a curved leg 38, 40 of the structure 36.

Attention is now directed to FIGS. 42-45 which illustrate one form of an apparatus 264 for forming a contoured composite structure having two curved legs, such as the frame section 36 shown in FIG. 2, wherein the legs comprise a curved inner leg or chord 40 and a curved outer leg or chord 38. The charge 230 may be similar to that previously described which includes both non-zero degree plies and one or more zero degree plies 231 containing tow segments 240 that aid in forming leg portions 234, 236 without substantial buckling, bridging, wrinkling and/or waving. As will be discussed below, the forming apparatus 264 may be used to form both the inner and outer leg portions 234, 236 of the charge 230 substantially simultaneously in a single forming operation. The apparatus 264 broadly includes a tool assembly 266 mounted on a substantially flat base 268, and a bladder-like vacuum bag 270. The vacuum bag 270 is mounted on a surrounding frame 272 which is pivotally secured to the base 268. The bag 270 includes a peripheral seal 275 which forms a vacuum tight seal between the bag 270 and the base 268 when the frame 272 is pivoted down over and onto the base 268. The tool assembly 266 includes a curved stationary tool mandrel 274 and a curved forming tool 276 mounted at its opposite ends for linear movement on the mandrel 274 by linear actuators 280. The forming tool 276 acts as a stabilizer that supports the web portion 232 of the charge 230 while forming the inner and outer leg portions 234, 236.

Figure 43:
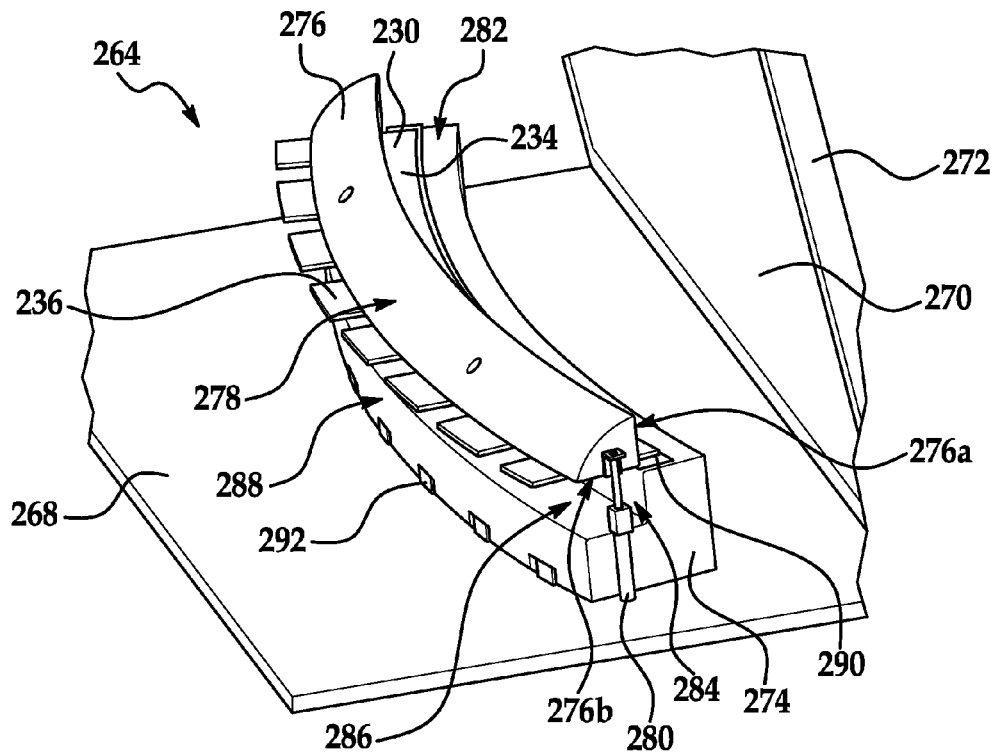
FIG. 43 is an illustration similar to FIG. 42 but showing a flat composite charge having been stabilized in the tool in preparation for forming.

The mandrel 274 includes three contiguous surfaces 284, 286 and 288 against which a flat charge 230 (FIG. 43) may be formed. The mandrel 274 further includes a curved, upper flat surface 282 having an electric heater strip 290 thereon for purposes which will become later apparent. The forming tool 276 includes two curved surfaces 276a, 276b (FIG. 43) which respectively face tool surfaces 284, 286 on the mandrel 274, and an outer surface that is curved in two dimensions. The linear actuators 280 may be power operated for moving the tool 276 from the raised loading/unloading position shown in FIG. 43 to a closed, forming position shown in FIG. 44. With the forming tool 276 in its raised position as shown in FIG. 43, the flat composite charge 230 may be placed on the upper surface 282 of the mandrel 274 and beneath the lower surface 276b on the forming tool 276, as shown in FIG. 43.

Figure 44:
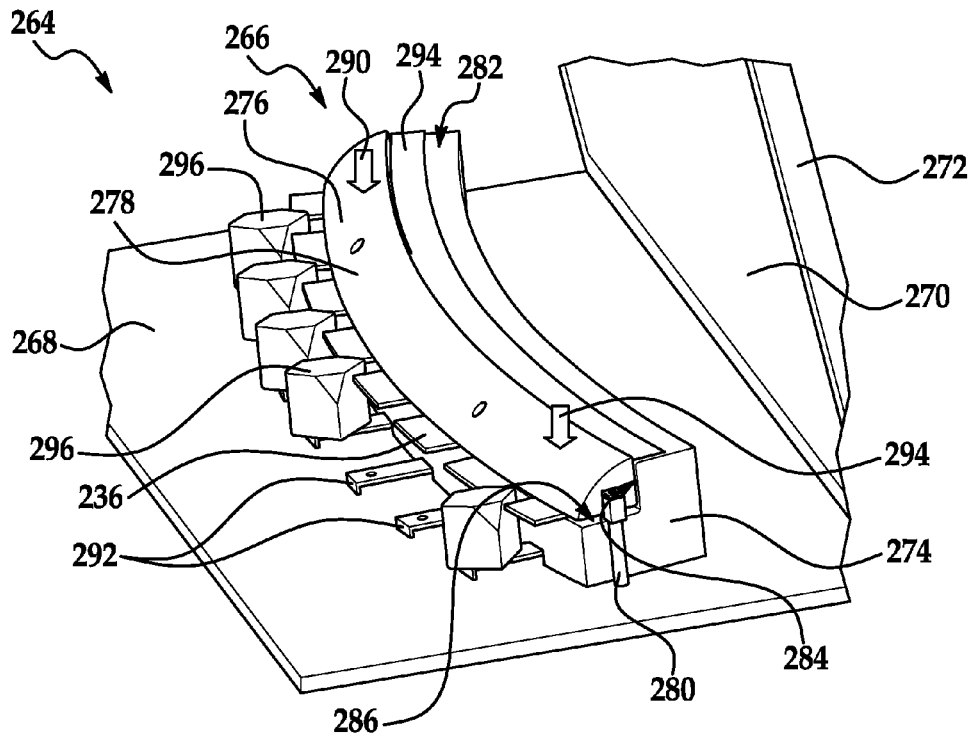
FIG. 44 is an illustration similar to FIG. 43 but showing one curved leg on the structure having been formed, two of the forming aids having been removed for clarity.
Figure 45:
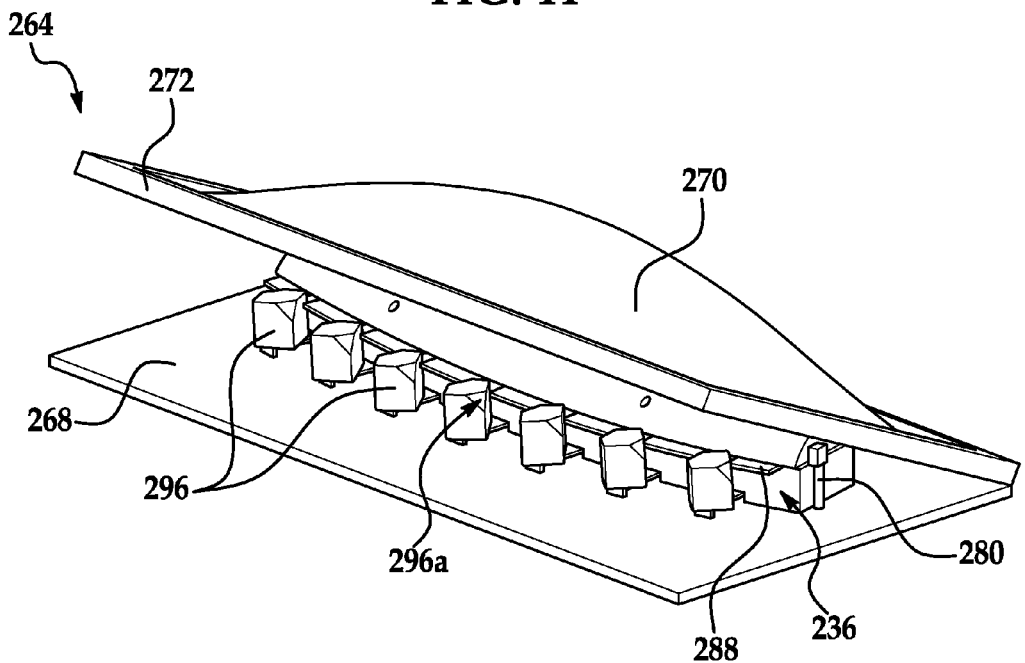
FIG. 45 is an illustration of a perspective view of the apparatus shown in FIGS. 42-44 in which the vacuum bag is being closed over the tool in preparation for forming a portion of the charge into second curved leg.

The tool assembly 266 further includes a plurality of slideable supports 292 along the bottom edge of the front tool surface 288. Each of the supports 292 is slideable from a retracted position inside the base tool 274 as shown in FIG. 43 to an extended position as shown in FIG. 44. Charge forming blocks 296 are respectively removably attached to each of the supports 292 and function to aid in forming the outer leg portion 236 of the charge 230 and in guiding the deformation of the bag 270 as the bag forms the outer leg portion 236 down onto the tool surface 288. Although not shown in the figures, expendable release materials may be used to help the charge 230 slide to shape and keep it from sticking to the mandrel 274 and/or the forming tool 276.

Figure 46:
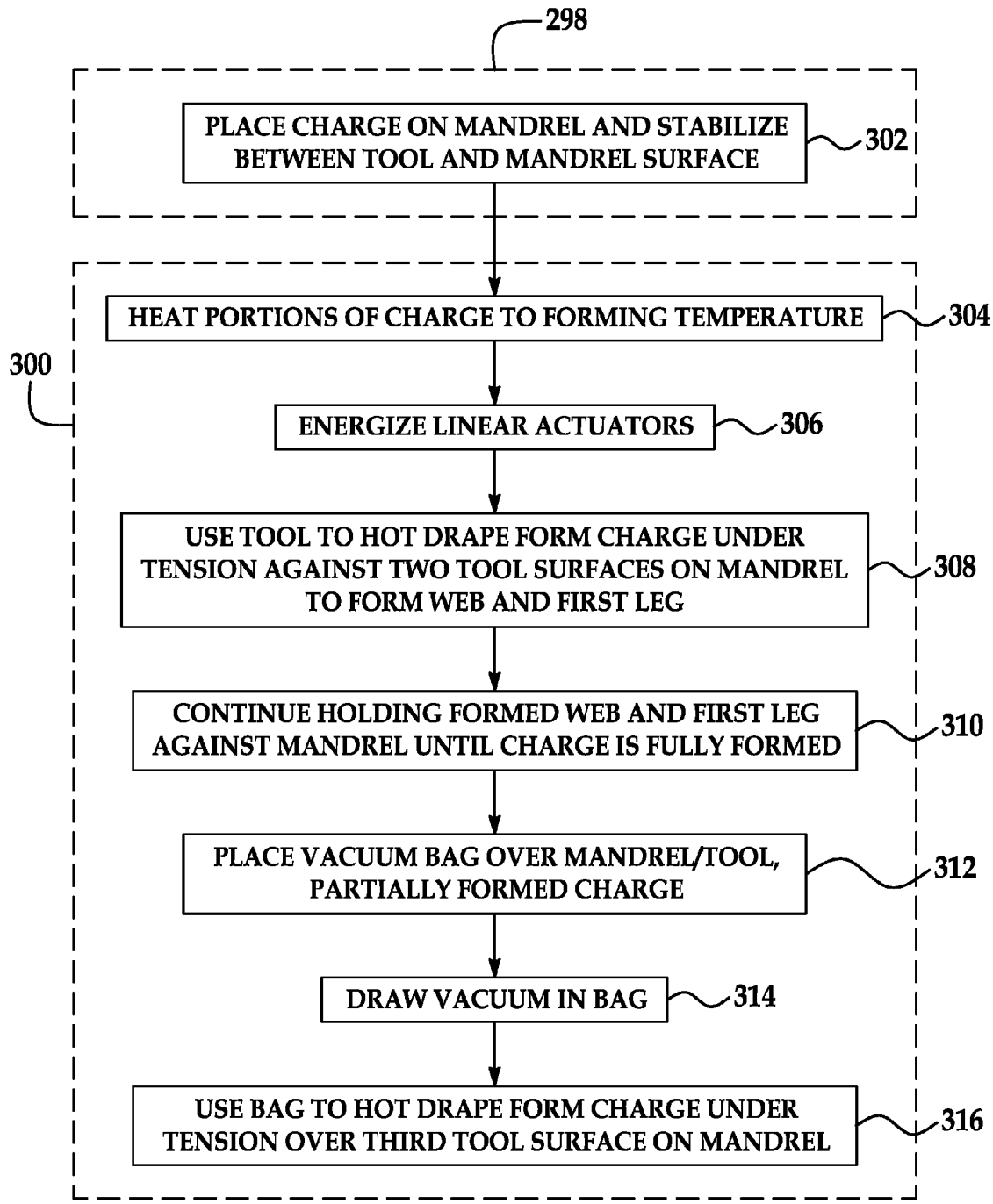
FIG. 46 is an illustration of a flow diagram of a method of forming a contoured composite structure having two curved legs using the apparatus shown in FIGS. 42-45.

Attention is now directed to FIG. 46 which illustrates the steps of a method of fabricating a curved composite structure 36 (FIGS. 1 and 2) having a pair of curved legs 38, 40. Broadly, the method comprises placing a flat composite charge 230 on a mandrel 274 at 298, and using the mandrel 274, as shown at 300 to form the charge into a pair of curved legs 38, 40 connected by a curved web 42. More particularly, beginning at 302, a flat charge 230 is placed on the mandrel 274, and is stabilized between the surfaces 276b, 282 of the forming tool 276 and the mandrel 274, respectively. Next, at 304, the inner leg portion 234 is heated to a suitable forming temperature to lower the viscosity of the prepreg resin prior to forming, using the strip heater 290.

Although not shown in the Figures, additional electric heating elements can be located on or under the bag 270 and against the to-be-formed leg portions 234, 236 to heat these areas prior to forming. Next, linear actuators 280 are energized causing the forming tool 276 to move downwardly, compressing the flat charge 230 onto mandrel surfaces 284, 286. As the forming tool 276 moves downwardly, the flat charge 230 is hot drape formed under tension against the tool surfaces 284, 286, thereby forming the web 42 (FIG. 1) and a first, inner leg 40, as shown at 308. At step 310, the web portion 232 and the inner leg portion 234 (FIG. 30) of the charge 230 continue to be held between the forming tool 276 and the mandrel 274. At 312, the frame 272 is swung down onto the base 268 which creates a vacuum tight seal between the bag 270 and the base 268. At 314, a vacuum is drawn in the bag 270. At 316, the vacuum drawn in the bag 270 causes the bag 270 to be drawn down onto the outer leg portion 236 of the charge 230. Downward movement of the bag 270 is guided in part by the curved surface 278 on the forming tool 276, and the forming blocks 296 which guide the bag 270 to apply pressure to the outer leg portion 236 of the charge 230 and form leg portions 236 onto the front tool surface 288 of the mandrel 274. Although not shown in FIG. 46, the tool assembly 266 may be used as a cure tool for curing the formed charge.

Figure 47:
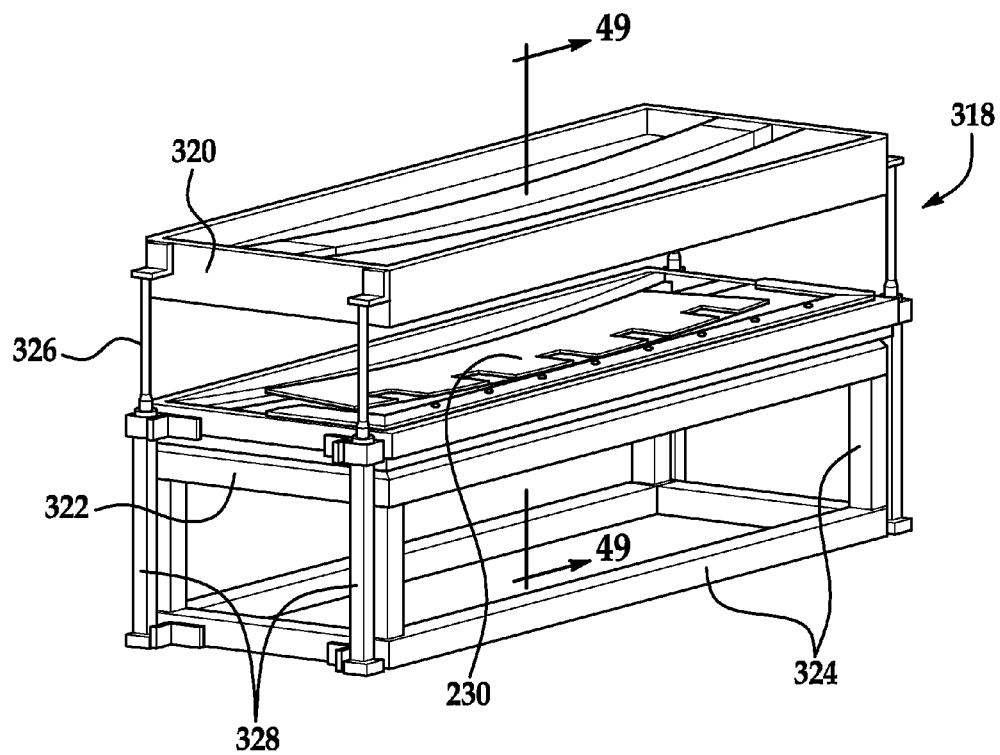
FIG. 47 is an illustration of a perspective view of an alternate embodiment of an apparatus for forming a flat composite charge into a contoured composite structure having two curved legs.
Figure 48:
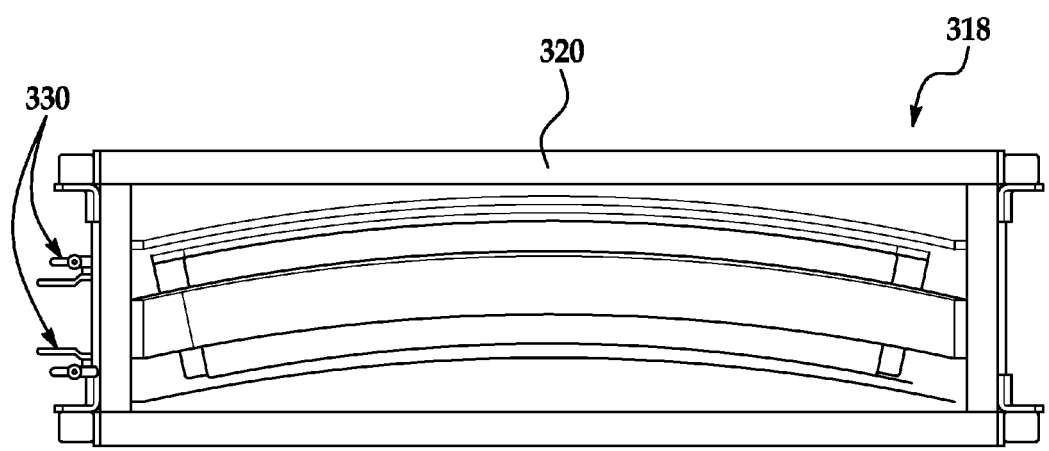
FIG. 48 is an illustration of a plan view of the apparatus shown in FIG. 47.

Referring now to FIGS. 47 and 48, a forming cell 318 may be used to hot drape form a flat composite ply stack or charge 230 into a contoured composite structure such as that shown in FIG. 1 having multiple legs 38, 40 in which the legs 38, 40 are formed substantially simultaneously in a single forming operation. The charge 230 may be similar to the described previously in connection with FIGS. 30-41. The forming cell 318 may be used to form multi-leg shaped composite structures, including but not limited to those having C, J, L, Z, V and I cross sectional shapes, with a large variety of orientations, arc lengths and overall geometries. Like the forming apparatus 264 illustrated in FIGS. 42-45, use of the forming cell 318 may eliminate the need to flip and/or transfer the charge 230 between layup and forming steps. Also, like the forming apparatus 264 illustrated in FIGS. 42-45, the forming cell 318 allows the web fibers to be laid directly to shape during the forming operation, and does not require secondary forming and/or heating operations.

The forming cell 318 comprises a pair of matched tool halves 320, 322 supported on the frame 324. The upper tool half 320 is mounted for linear movement toward and away from the lower tool half 322 by means of linear actuators 328 which include shafts 326 coupled with the upper tool half 320. The upper and lower tool halves 320, 322 are provided with vacuum connections 330 which, as will be discussed below, are coupled with a vacuum source (not shown) for drawing vacuums used to form curved legs on the flat composite charge 230.

Figure 49:
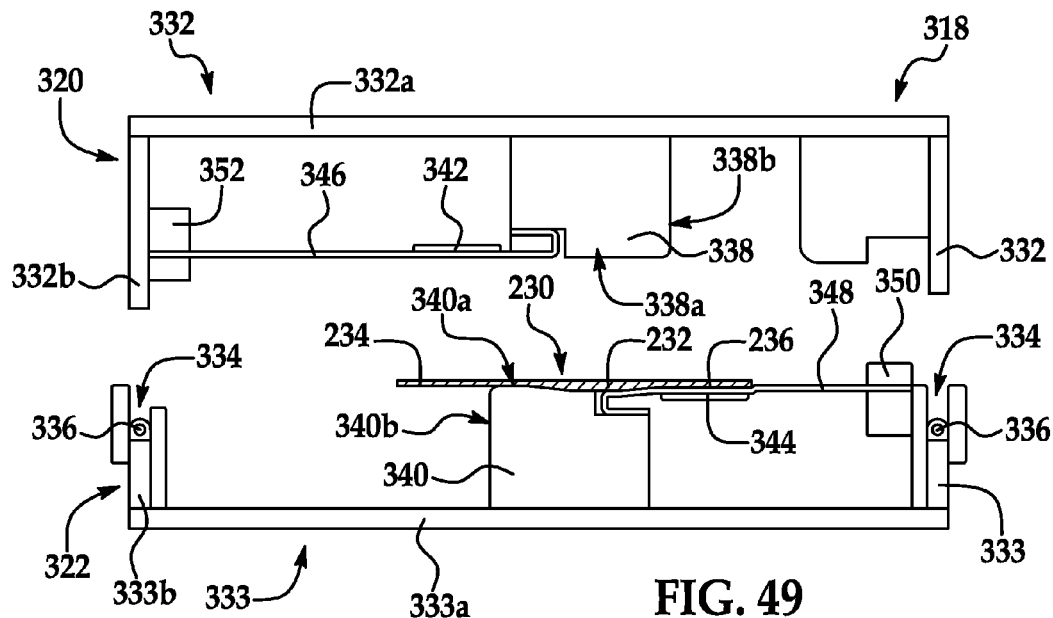
FIG. 49 is an illustration of a sectional view taken along the line 49-49 in FIG. 47.

Referring now to FIG. 49, the upper and lower tool halves 320, 322 respectively include enclosed frames 332, 333. The frames 332, 333 respectively include end walls 332a, 333a connected to side walls 332b, 333b. The side walls 332b are aligned with a peripheral seal 336 disposed within a peripheral groove 334 in the side walls 333b of the lower frame 333. As will be discussed later, the upper frame side walls 332b are received within groove 334 when the tool halves 320, 322 are closed, forming a vacuum tight seal. Tool halves 320, 322 respectively include upper and lower, matched mandrels 338, 340. Mandrels 338, 340 respectively include opposing tool surfaces 338a, 340a between which a web portion 232 of the charge 230 may be clamped, as will be discussed below. The upper mandrel 338 includes a forming surface 338b over which the outer leg portion 236 of the charge 230 is formed. Similarly, the lower mandrel 340 includes a forming surface 340b over which the inner leg portion 234 of the charge 230 is formed.

Figure 50:
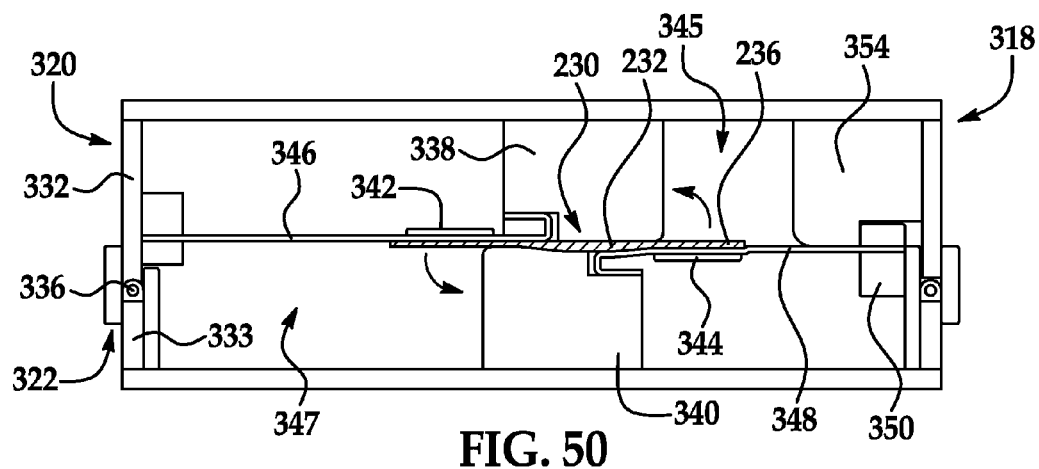
FIG. 50 is an illustration similar to FIG. 49 but showing the upper and lower tool assemblies having been closed to clamp a flat composite charge in preparation for a forming operation.

The upper tool half 320 includes a vacuum bag 346 stretched between a clamp 352 and mandrel 338. Vacuum bag 346 overlies leg portion 234 of the charge 230 and forms a first vacuum chamber 347, shown in FIG. 50, when the tool halves 320, 322 are closed. Similarly, a second vacuum bag 348 is stretched between the lower mandrel 340 and a clamp 350. The vacuum bag 348 underlies the leg portion 236 of the charge 230 and forms a second vacuum chamber 345 when the tool halves 320, 322 are closed, as shown in FIG. 50. Electrical strip heaters 342, 344 may be placed over the bags 346, 348 respectively in registration with the leg portions 234, 236 for heating these portions of the charge 230 to forming temperature. One or more forming aids, such as the forming aid 354 forming part of the upper tool half 320 may be employed to assist in shaping the bags 346, 348 as they deform under vacuum pressure during the forming process.

FIG. 50 illustrates the tool halves 320, 322 having been closed and sealed, but prior to the application of vacuum to vacuum chambers 345, 347. With the tool halves 320, 322 closed, the web portion 232 of the charge 230 is clamped, and held between the upper and lower mandrels 338, 340. At this point, heating elements 342, 344 may be energized to heat the leg portions 234, 236 of the charge 230 to an appropriate forming temperature.

Figure 51:
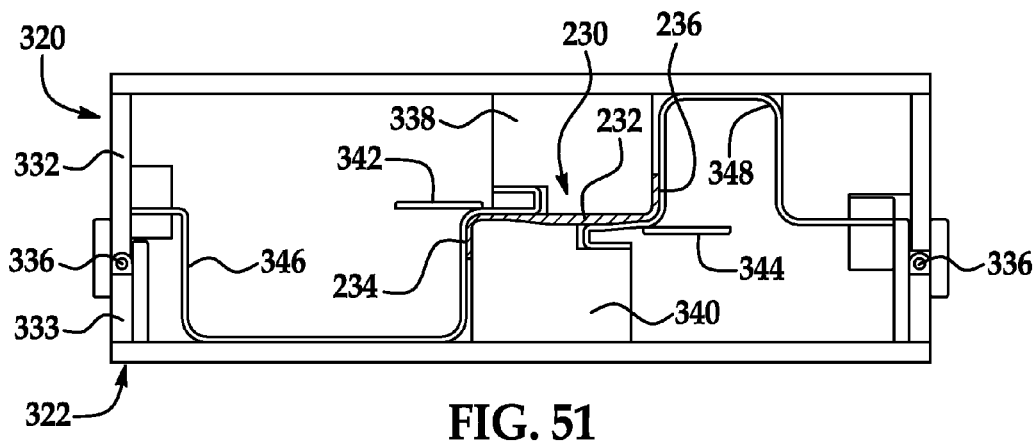
FIG. 51 is an illustration similar to FIG. 50 but showing the curved legs having been formed.

FIG. 51 shows the positions of the vacuum bags 346, 348 after a vacuum has been drawn in vacuum chambers 345, 347. The applied vacuums draw the bags 346, 348 respectively into the vacuum chambers 347, 345, applying pressure to the leg portions 234, 236 and causing the leg portions 234, 236 to be respectively formed down over tool surfaces 338b, 340b of mandrels 338, 340. One or more of the forming aids 354 may be employed to assist and guide the bag 348 in drawing down against the leg portion 236 of the charge during the forming process. It should be noted here that vacuums may be drawn in vacuum chambers 345, 347 sequentially or simultaneously so as to form the leg portions 234, 236 substantially simultaneously or sequentially in a single forming operation. When the charge 230 is fully formed, the vacuums may be released in the vacuum chambers 345, 347, following which the bags return to the position shown in FIG. 50 and the tool halves 320, 322 may be opened to allow removal of the formed part.

Figure 52:
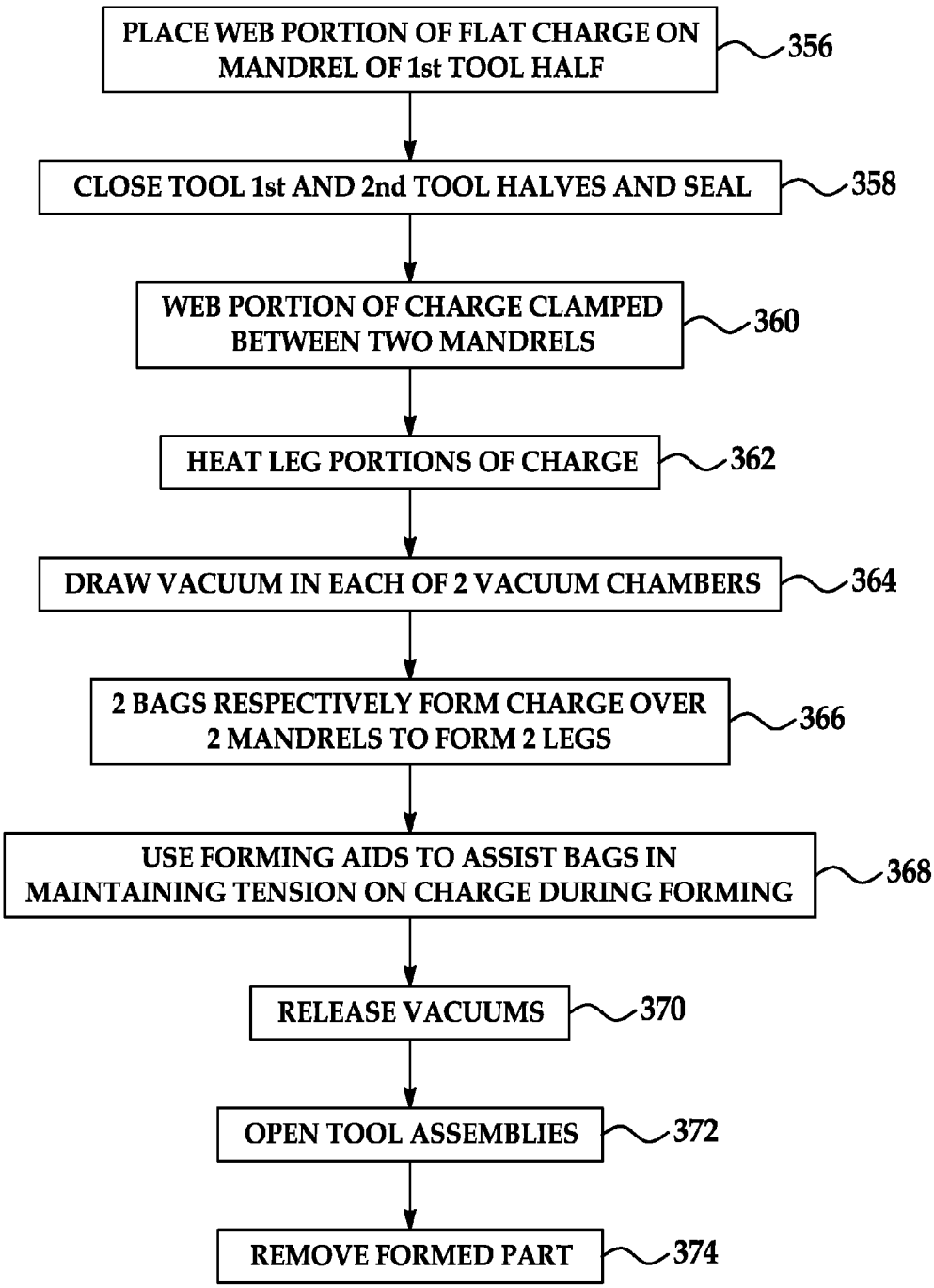
FIG. 52 is a flow diagram of a method of fabricating a contoured composite structure having two curved legs, using the apparatus shown in FIGS. 47-51.

FIG. 52 illustrates the overall steps of a method of forming a contoured composite structure 36 (FIG. 2) having two curved legs 38, 40 using the forming cell 318 of the type shown in FIGS. 47-51. Beginning at 356, a web portion 232 of a flat charge 230 is placed on a mandrel 340 of a first tool half. Then, at 358, first and second tool halves are closed and sealed together. At 360, the web portion 232 of the charge 230 is clamped between two mandrels 338, 340 of the first and second tool halves 320, 322 respectively, thereby holding and stabilizing the charge 230 during subsequent forming operations. At 362, one or both of leg portions 234, 236 of the charge 230 are heated, following which, at 364, a vacuum is drawn in each of two vacuum chambers 345, 347 respectively forming part of the first and second tool halves 320, 322. At 366, the vacuums drawn in the bags 346, 348 respectively caused the bags 346, 348 to sweep the leg portions 234, 236 of the charge 230 down over mandrel surfaces 338b, 340b to form two legs 38, 40 of the contoured composite structure 36 shown in FIG. 2. At 368, one or more forming aids 354 may be used to assist a bag 348 in maintaining tension on the charge 230 during the forming process. At 370, the vacuums are released, following which, at 372 the tool halves 320, 322 are opened, allowing the formed part to be removed at 374.

Figure 53:
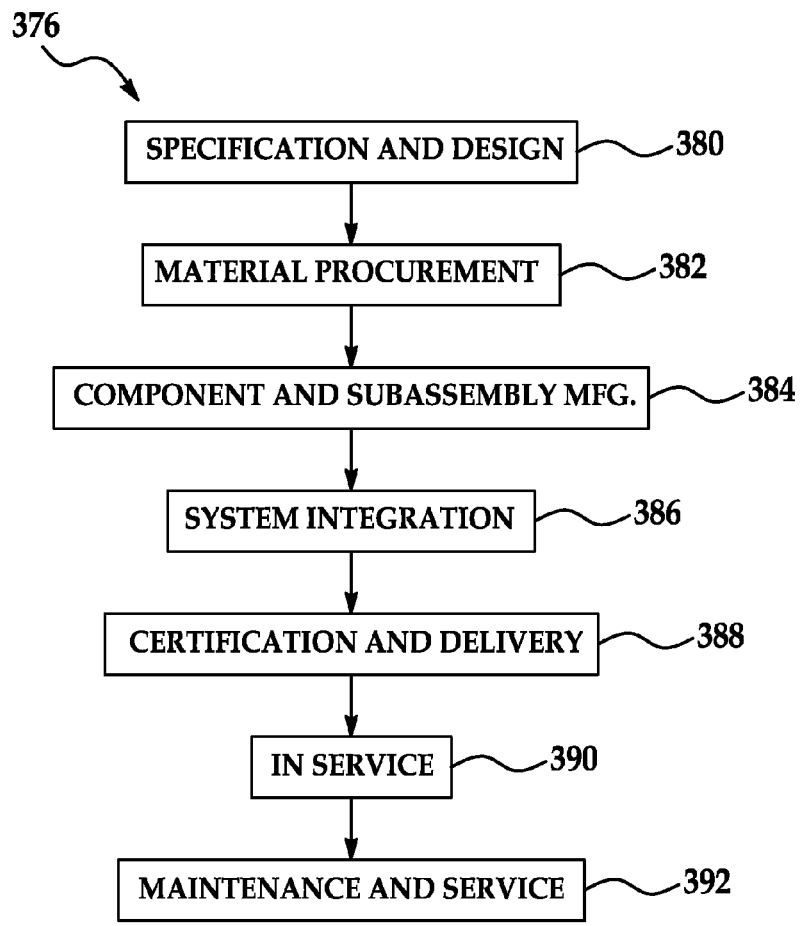
FIG. 53 illustrates a flow diagram of aircraft production and service methodology.
Figure 54:
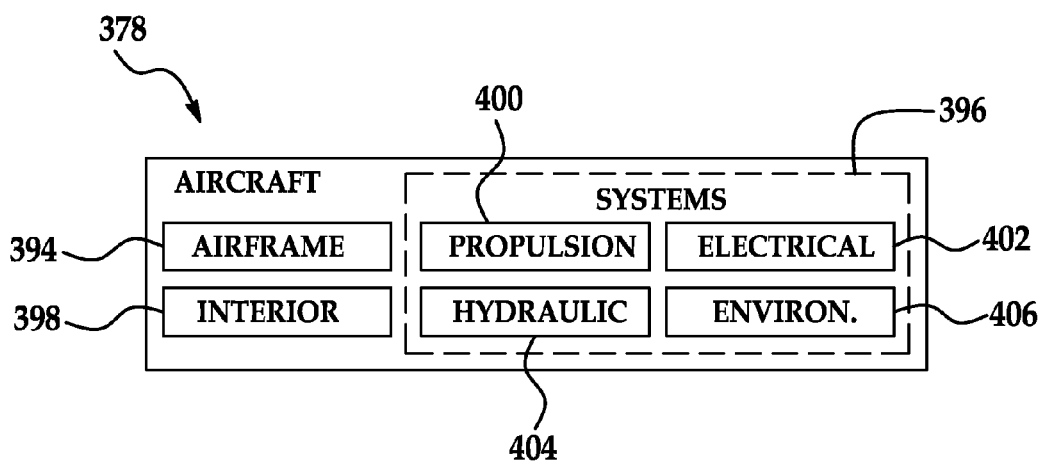
FIG. 54 illustrates a block diagram of an aircraft.

Embodiments of the disclosure may find use in a variety of potential applications, particularly in the transportation industry, including for example, aerospace, marine and automotive applications. Thus, referring now to FIGS. 53 and 54, embodiments of the disclosure may be used in the context of an aircraft manufacturing and service method 376 as shown in FIG. 53 and an aircraft 378 as shown in FIG. 54. Aircraft applications of the disclosed embodiments may include, for example, without limitation, composite stiffened members such as stiffeners, beams, and stringers, to name only a few. During pre-production, exemplary method 376 may include specification and design 380 of the aircraft 378 and material procurement 382 in which the disclosed contoured structures are specified for use in the aircraft 378. During production, component and subassembly manufacturing 384 and system integration 386 of the aircraft 378 takes place, in which various components and subassemblies are fabricated using the disclosed method. Thereafter, the aircraft 378 may go through certification and delivery 388 in order to be placed in service 390. While in service by a customer, the aircraft 378 is scheduled for routine maintenance and service 392 (which may also include modification, reconfiguration, refurbishment, and so on), which may include the use of the disclosed contoured structures.

Each of the processes of method 376 may be performed or carried out by a system integrator, a third party, and/or an operator (e.g., a customer). For the purposes of this description, a system integrator may include without limitation any number of aircraft manufacturers and major-system subcontractors; a third party may include without limitation any number of vendors, subcontractors, and suppliers; and an operator may be an airline, leasing company, military entity, service organization, and so on.

As shown in FIG. 54, the aircraft 378 produced by exemplary method 376 may include an airframe 394 with a plurality of systems 396 and an interior 398. Examples of high-level systems 396 include one or more of a propulsion system 400, an electrical system 402, a hydraulic system 404, and an environmental system 406. Any number of other systems may be included. Although an aerospace example is shown, the principles of the disclosure may be applied to other industries, such as the marine and automotive industries.

Systems and methods embodied herein may be employed during any one or more of the stages of the production and service method 376. For example, components or subassemblies corresponding to production process 384 may be fabricated or manufactured in a manner similar to components or subassemblies produced while the aircraft 378 is in service. Also, one or more apparatus embodiments, method embodiments, or a combination thereof may be utilized during the production stages 384 and 386, for example, by substantially expediting assembly of or reducing the cost of an aircraft 378. Similarly, one or more of apparatus embodiments, method embodiments, or a combination thereof may be utilized while the aircraft 378 is in service, for example and without limitation, to maintenance and service 392.

Although the embodiments of this disclosure have been described with respect to certain exemplary embodiments, it is to be understood that the specific embodiments are for purposes of illustration and not limitation, as other variations will occur to those of skill in the art.

What is claimed is:

1. A method of fabricating a contoured composite structure comprising an axis of curvature and at least one curved leg, the method comprising forming a flat stack by:
   laying up a first set of prepreg fiber plies comprising a non-zero degree fiber orientations relative to the axis of curvature;
   laying up, a second prepreg fiber ply comprising a zero degree fiber orientation relative to the axis of curvature, the second prepreg fiber ply comprising a web portion and an inner leg portion, the web portion comprising continuous tows, and the inner leg portion comprising segmented tows, the segmented tows comprising segments in different radial positions with ends staggered relative to each other and positioned so that adjacent ends of the segments comprise an overlap at the adjacent ends; and
   forming the flat stack, comprising the zero degree fiber orientation, into a web from the web portion and the at least one curved leg from the inner leg portion, the forming comprising moving the adjacent ends of the segments that comprise the overlap to a substantially abutting position.

2. The method of claim 1, wherein forming the stack includes forming the at least one curved leg to a larger radius.

3. The method of claim 1, further comprising laying up the segmented tows including arranging the segmented tows end-to-end.

4. A method of fabricating a contoured composite structure comprising an axis of curvature and at least one curved leg, the method comprising:
cutting a number of tows to form segmented fiber tows;
laying up a flat stack comprising a first set of prepreg fiber plies, the plies comprising the segmented fiber tows comprising first unidirectional fibers oriented at zero degrees relative to the axis of curvature, and aligning the segmented fiber tows relative to the axis of curvature, the prepreg fiber plies comprising a central web portion and one of an inner leg portion and an outer leg portion, the central web portion comprising continuous fiber tows, and at least one of the inner leg portion and the outer leg portion comprising the segmented fiber tows, such that the laying up of the plies further comprises placing the segmented fiber tows in an end-to-end relationship, the segmented fiber tows comprising adjacent segments with ends staggered relative to each other, the segmented fiber tows positioned so that adjacent ends of adjacent segments in the inner leg portion comprise an overlap at the adjacent ends and adjacent segments in the outer leg portion comprise a gap at the adjacent ends, the flat stack also comprising a plurality of non-zero degree plies comprising second unidirectional fibers comprising non-zero fiber orientations relative to the axis of curvature wherein the plurality of non-zero degree plies form fiber ply segments in an overlapping relationship such that adjacent ply segments form a pie-shaped lap near the inner leg portion and a pie-shaped gap adjacent the outer leg portion such that at least one zero degree ply comprises a zero degree fiber orientation relative to the axis of curvature in the inner leg portion or the outer leg portion; and
forming the at least one curved leg from the flat stack by forming one of the inner leg portion and the outer leg portion and the outer leg portion over a curved tool, the forming moving the adjacent ends comprising at least one of: the gap, and the overlap, to a substantially abutting position.

5. The method of claim 4, wherein placing the segmented fiber tows end-to-end includes maintaining the gap between the segmented fiber tows substantially constant.

6. The method of claim 4, wherein cutting the tows includes cutting the tows to form substantially constant length segmented fiber tows.

7. The method of claim 4, wherein cutting the tows includes cutting the tows to segmented fiber tows of varying lengths.

8. A method of fabricating a contoured composite structure, the method comprising:
placing a flat composite charge on a mandrel, the flat composite charge comprising:
unidirectional fiber tows aligned to zero degrees relative to an axis of curvature of the contoured composite structure;
an outer leg portion;
a central web portion; and
an inner leg portion, the central web portion comprising continuous fiber tows, the inner leg portion and the outer leg portion each comprising segmented fiber tows in end-to-end configuration, the segmented fiber tows comprising adjacent segments with ends staggered relative to each other and positioned so that adjacent ends of the adjacent segments in the inner leg portion comprise an overlap, the flat composite charge also comprising a plurality of non-zero degree plies comprising unidirectional non-zero fiber orientations relative to the axis of curvature, the non-zero degree plies comprising fiber ply segments in an overlapping relationship such that adjacent ply segments form a pie-shaped lap near the inner leg portion and a pie-shaped gap adjacent the outer leg portion, such that at least one zero degree ply comprises a zero degree fiber orientation relative to the axis of curvature, the segmented fiber tows positioned so that adjacent ends of adjacent segments in the leg portion comprise at least one of: the overlap, and a gap at the adjacent ends; and
using the mandrel to form the charge into a pair of curved legs connected by a curved web, the forming moving the adjacent ends comprising at least one of: the gap, and the overlap to a substantially abutting position.

9. The method of claim 8, further comprising:
stabilizing a position of the flat composite charge in preparation for forming by holding the flat composite charge between a tool and a surface on the mandrel.

10. The method of claim 8, wherein using the mandrel to form the flat composite charge comprises:
using a tool to form the outer leg of the flat composite charge onto two surfaces on the mandrel.

11. The method of claim 10, wherein using the tool to form the outer leg of the flat composite charge comprises moving the tool relative to the mandrel using actuators.

12. The method of claim 10, wherein using the mandrel to form the flat composite charge comprises:
holding the flat composite charge against the two surfaces, and
forming the inner leg of the flat composite charge against another surface on the mandrel while the charge is being held.

13. The method of claim 8, further comprising heating areas of the flat composite charge prior to forming the flat composite charge.

14. The method of claim 12, wherein forming the inner leg of the flat composite charge comprises using forming aids to guide movement of the inner leg of the flat composite charge toward and onto the another surface of the mandrel.

15. The method of claim 1, wherein the segmented tows having adjacent segments with ends staggered relative to each other are staggered in a random pattern.

16. The method of claim 1, wherein the segmented tows having adjacent segments with ends staggered relative to each other in a staggered pattern in which a meeting of adjacent ends occurs at successively greater distances from an end portion of the web.

17. The method of claim 1, further comprising an outer leg portion comprising segmented tows positioned such that a gap separates adjacent ends of the segmented tows.

* * * * *